(12) United States Patent  (10) Patent No.: US 6,991,988 B2
Forbes et al.  (45) Date of Patent: Jan. 31, 2006

(54) STATIC PASS TRANSISTOR LOGIC WITH TRANSISTORS WITH MULTIPLE VERTICAL GATES

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 10/790,510

(22) Filed: Mar. 1, 2004

(65) Prior Publication Data

US 2004/0175881 A1   Sep. 9, 2004

Related U.S. Application Data

(62) Division of application No. 09/580,901, filed on May 30, 2000, now Pat. No. 6,744,082.

(51) Int. Cl.
*H01L 21/8234* (2006.01)

(52) U.S. Cl. .................... 438/275; 438/278
(58) Field of Classification Search ............... 438/275, 438/278

See application file for complete search history.

(56) References Cited

U.S. PATENT DOCUMENTS

| 4,051,354 | A | 9/1977 | Choate ..................... 235/312 |
| 4,454,524 | A | 6/1984 | Spence ....................... 357/23 |
| 4,673,962 | A | 6/1987 | Chatterjee et al. .......... 357/23.6 |
| 4,859,623 | A | 8/1989 | Busta ........................... 437/48 |
| 4,893,170 | A | 1/1990 | Tokuda et al. ................ 357/71 |
| 4,962,327 | A | 10/1990 | Iwazaki ................. 365/230.06 |
| 5,126,596 | A | 6/1992 | Millman ..................... 307/451 |
| 5,149,664 | A | 9/1992 | Shin et al. |
| 5,157,471 | A | 10/1992 | Kojima et al. |
| 5,250,835 | A | 10/1993 | Izawa ........................ 257/408 |
| 5,315,151 | A | 5/1994 | Hsieh et al. ................. 257/592 |
| 5,327,380 | A | 7/1994 | Kersh, III et al. .......... 365/195 |
| 5,386,132 | A | 1/1995 | Wong ........................ 257/316 |
| 5,446,304 | A | 8/1995 | Sameshima et al. ........ 257/365 |
| 5,583,360 | A | 12/1996 | Ruth et al. ................. 257/316 |

(Continued)

FOREIGN PATENT DOCUMENTS

EP   0444712   9/1991

(Continued)

OTHER PUBLICATIONS

"Frequently-Asked Questions (FAQ) About Programmable Logic", *OptiMagic, Inc.*, http://www.optimagic.com/faq.html,(1997),pp. 1-18.

(Continued)

*Primary Examiner*—W. David Coleman
(74) *Attorney, Agent, or Firm*—Schwegman, Lundberg, Woessner & Kluth, P.A.

(57) ABSTRACT

Static pass transistor logic having transistors with multiple vertical gates are described. Multiple vertical gates are edge defined with only a single transistor being required for multiple logic inputs. Thus a minimal surface area is required for each logic input. The static pass transistor includes a transistor which has a horizontal depletion mode channel region between a single source and drain region. A number of vertical gates are located above different portions of the depletion mode channel region. A vertical gate is located above a first portion of the depletion mode channel region and is separated therefrom by a first insulator material. A vertical gate is located above a second portion of the channel region and is separated therefrom by a second insulator material. There is no source nor drain region associated with each input and the gates have sub-lithographic horizontal dimensions by virtue of being edge defined vertical gates.

60 Claims, 14 Drawing Sheets

U.S. PATENT DOCUMENTS

| | | | |
|---|---|---|---|
| 5,658,808 A | 8/1997 | Lin | 438/155 |
| 5,661,055 A | 8/1997 | Hsu et al. | 438/259 |
| 5,759,920 A | 6/1998 | Burns, Jr. et al. | 438/696 |
| 5,837,573 A | 11/1998 | Guo | 438/238 |
| 5,847,425 A | 12/1998 | Yuan et al. | 257/315 |
| 5,898,322 A | 4/1999 | Kubota et al. | 326/113 |
| 5,910,912 A | 6/1999 | Hsu et al. | 365/185.01 |
| 5,991,225 A | 11/1999 | Forbes et al. | 365/230.06 |
| 6,177,811 B1 | 1/2001 | Fuse et al. | 326/119 |
| 6,219,299 B1 | 4/2001 | Forbes et al. | 365/230.06 |
| 6,373,291 B1 | 4/2002 | Hamada et al. | 326/113 |
| 6,448,615 B1 | 9/2002 | Forbes et al. | 257/369 |

FOREIGN PATENT DOCUMENTS

| | | |
|---|---|---|
| EP | 649174 | 4/1995 |
| JP | 5160411 | 6/1993 |
| WO | WO-86/05935 A1 | 10/1986 |

OTHER PUBLICATIONS

Bernstein, K., et al., "High-Speed Design Styles Leverage IBM Technology Prowess", *MicroNews*, 4(3), (1998),pp. 1-7.

Chen, W., et al., "Very uniform and high aspect ratio anisotrophy SIO2 etching process in magnetic neutral loop discharge plasma", *J. Vac. Sci. Technol. A*, 17(5), (1999),pp. 2546-2550.

Cheng, K., et al., "A 1.2V CMOS Multiplier Using Low-Power Current-Sensing Complementary Pass-Transistor Logic", *Proc. Third Int. Conf. on Electrics, Circuits and Systems*, (1996),pp. 1037-1040.

Dipert, Brian, "Flash Memory Goes Mainstream", *IEEE Spectrum*, 30(10), (Oct. 1993),48-52.

Fuse, T., et al., "A 0.5V 200MHz 1-Stage 32b ALU Using a Body Bias Controlled SOI Pass-Gate Logic", *1997 IEEE International Solid-State Circuits Conference, Digest of Technical Papers*, (1997),286-287.

Glasser, L A., *The Design and Analysis of VLSI Circuits*, Addison-Wesley Publishing Company,(1985),pp. 16-21.

Hodges, D. A., *Analysis and Design of Digital Integrated Circuits, 2nd Edition*, McGraw-Hill Publishing. New York, (1988),pp. 354-357.

Hodges, D. A., et al., *Analysis and Design of Digital Integrated Circuits*, McGraw-Hill Book Company, 2nd Edition,(1988),394-396.

Johnson, J., et al., "IBM's 0.5 micrometer Embedded Flash Memory Technology", *MicroNews*, 4(3), http://www.chips.ibm.com/micronews/vol14_no3/flash.html,(1998),pp. 1-7.

Kayed, S. I., et al., "CMOS Differential Pass-Transistor Logic (CMOS DPTL) Predischarge Buffer Design", *Proceedings of the Thirteenth National Radio Science Conference*, Cairo, Egypt,(1996),pp. 527-235.

Landheer, D., et al., "Formation of high-quality silicon dioxide films by electron cyclotron resonance plasma oxidation and plasma-enhanced chemical vapour deposition", *Thin Solid Films*, 293, (1997),pp. 52-62.

Moore, Will R., "A Review of Fault-Tolerant Techniques for the Enhancement of Integrated Ccircuit Yield", *Proceedings fo the IEEE*, 74(5), (May 1986),684-698.

Nozawa, R., et al., "Low temperature polycrystalline silicon film formation with and without charged species in an electron cyclotron resonance SiH4/H2 plasma-enhanced chemical vapor deposition", *J. Vac. Sci. Technol. A*, 17(5), (1999),pp. 2542-2545.

Oklobdzija, V. G., "Differential and pass-transistor CMOS logic for high performance systems", *Microelectronics Journal*, 29, (1998),pp. 679-688.

Patel, P., et al., "Low temperature VUV enhanced growth of thin silicon dioxide films", *Applied Surface Science*, 46, (1990),pp. 352-356.

Rabaey, J. M., *Digital Integrated Circuits—A Design Perspective*, Prenctice Hall,(1996),pp. 210-222.

Rueger, N. R., et al., "Selective etching of SiO2 over polycrystalline silicon using CHF3 in an inductively coupled plasma", *J. Vac. Sci. Technol. A*, 17(5), (1999),pp. 2492-2502.

Shindo, W., et al., "Low-temperature large-grain poly-Si direct deposition by microwave plasma enhanced chemical vapor disposition using SiH4/Xe", *J. Vac. Sci. Technol. A*, 17(5), (1999),pp. 3134-3138.

Tretz, C., et al., "Performance Comparison of Differential Static CMOS Circuit Topologies in SOI Technology", *Proceedings 1998 IEEE International SOI Conference*, (1998),pp. 123-124.

Usami, K., et al., "Thin Si Oxide films for MIS tunnel emitter by hollow cathode enhanced plasma", *Thin Films*, 281-282, (1996),pp. 412-414.

Vallon, S., et al., "Polysilicon-germanium gate patterning studies in a high density plasma helicon source", *J. Vac. Sci. Technol. A*, 15(4), (1997),pp. 1874-1880.

Yamashita, S., et al., "Pass-Transistor/CMOS Collaborated Logic: The Best of Both Worlds", *1997 Symposium on VLSI Circuits Digest of Technical Papers*, (1997),pp. 31-32.

Yano, K., et al., "Top-Down Pass-Transistor Logic Design", *IEEE Journal of Solid-State Circuits*, 31(6), (1996),pp. 792-803.

Zimmermann, R., et al., "Low-Power Logic Styles: CMOS Versus Pass-Transistor Logic", *IEEE Journal of Solid-State Circuits*, 32(7), (1997),pp. 1079-1090.

STATIC PASS TRANSISTOR LOGIC WITH TRANSISTORS WITH MULTIPLE VERTICAL GATES

CROSS REFERENCE TO RELATED APPLICATIONS

This application is a Divisional of U.S. application Ser. No. 09/580,901, filed May 30, 2000, now U.S. Pat. No. 6,744,082, which is incorporated herein by reference.

This application is related to the following, commonly assigned U.S. patent application Ser. No. 09/580,860, filed May 30, 2000, now U.S. Pat. No. 6,222,788 which disclosure is herein incorporated by reference.

TECHNICAL FIELD OF THE INVENTION

This invention relates generally to integrated circuits and in particular to static pass transistor logic with transistors with multiple vertical gates.

BACKGROUND OF THE INVENTION

Many logic circuits include multiple transistors arrayed such that a combination of activated transistors produce a logical function. Such transistors in the array are activated, in the case of MOSFET devices, by either applying or not applying a potential to the gate of the MOSFET. This action either turns on the transistor or turns off the transistor. Conventionally, each logical input to the logic circuit is applied to an independent MOSFET gate. Thus, according to the prior art, a full MOSFET is required for each input to the logic circuit. Requiring a full MOSFET for each logic input consumes a significant amount of chip surface area. Conventionally, the size of each full MOSFET, e.g. the space it occupies, is determined by the minimum lithographic feature dimension. Thus, the number of logical functions that can be performed by a given logic circuit is dependent upon the number of logical inputs which is dependent upon the available space to in which to fabricate an independent MOSFET for each logic input. In other words, the minimum lithographic feature size and available surface determine the functionality limits of the logic circuit.

Pass transistor logic is one of the oldest logic techniques and has been described and used in NMOS technology long before the advent of the CMOS technology currently employed in integrated circuits. A representative article by L. A. Glasser and D. W. Dobberpuhl, entitled "The design and analysis of VLSI circuits," Addison-Wesley, Reading Mass., 1985, pp. 16–20, describes the same. Pass transistor logic was later described for use in complementary pass transistor circuits in CMOS technology. Articles which outline such use include articles by J. M. Rabaey, entitled "Digital Integrated Circuits; A design perspective," Prentice Hall, Upper Saddle River, N.J., pp. 210–222, 1996, and an article by K. Bernstein et al., entitled "High-speed design styles leverage IBM technology prowess," MicroNews, vol. 4, no. 3, 1998. What more, there have been a number of recent applications of complementary pass transistor logic in microprocessors. Articles which describe such applications include articles by T. Fuse et al., entitled "A 0.5V 200 mhz 1-stage 32b ALU using body bias controlled SOI pass-gate logic," Dig. IEEE Int. Solid-State Circuits Conf., San Francisco, pp. 286–287, 1997, an article by K. Yano et al., entitled "Top-down pass-transistor logic design," IEEE J. Solid-State Circuits, Vol. 31, no. 6, pp. 792–803, June 1996, and an article by K. H. Cheng et al., entitled "A 1.2V CMOS multiplier using low-power current-sensing complementary pass-transistor logic", Proc. Third Int. Conf. On Electronics, Circuits and Systems, Rodos, Greece, 13–16 Oct., vol. 2, pp. 1037–40, 1996.

In another approach, differential pass transistor logic has been developed to overcome concerns about low noise margins in pass transistor logic. This has been described in an article by S. I. Kayed et al., entitled "CMOS differential pass-transistor logic (CMOS DPTL) predischarge buffer design," 13th National Radio Science Conf., Cairo, Egypt, pp. 527–34, 1996, as well as in an article by V. G. Oklobdzija, entitled "Differential and pass-transistor CMOS logic for high performance systems," Microelectronic J., vol. 29, no. 10, pp. 679–688, 1998. Combinations of pass-transistor and CMOS logic have also been described. S. Yamashita et al., "Pass-transistor? CMOS collaborated logic: the best of both worlds," Dig. Symp. On VLSI Circuits, Kyoto, Japan, 12–14 June, pp. 31–32, 1997. Also, a number of comparisons of pass transistor logic and standard CMOS logic have been made for a variety of different applications and power supply voltages. These studies are described in an article by R. Zimmerman et al., entitled "Low-power logic styles: CMOS versus pass transistor logic," IEEE J. Solid-State Circuits, vol. 32, no. 7, pp. 1079–1790, July 1997, and in an article by C. Tretz et al., "Performance comparison of differential static CMOS circuit topologies in SOI technology," Proc. IEEE Int. SOI Conference, October 5–8, FL, pp. 123–4, 1998.

However, all of these studies and articles on pass transistor logic have not provided a solution to the constraints placed on logic circuits by the limits of the minimum lithographic feature size and the deficit in the available chip surface space.

An approach which touches upon overcoming the limits of the minimum lithographic feature size and the deficit in the available chip surface space, is disclosed in the following co-pending, commonly assigned U.S. patent applications by Len Forbes and Kie Y. Ahn, entitled: "Programmable Logic Arrays with Transistors with Vertical Gates," Ser. No. 09/583,584, now U.S. Pat. No. 6,420,902, "Horizontal Memory Devices with Vertical Gates," Ser. No. 09/584,566, and "Programmable Memory Decode Circuits with Vertical Gates," Ser. No. 09/584,564, now U.S. Pat. No. 6,219,299. Those disclosures are all directed toward a non volatile memory cell structure having vertical floating gates and vertical control gates above a horizontal enhancement mode channel region. In those disclosures one or more of the vertical floating gates is charged by the application of potentials to an adjacent vertical gate. The devices of those disclosures can be used as flash memory, EAPROM, EEPROM devices, programmable memory address and decode circuits, and/or programmable logic arrays. Those applications, however, are not framed to address overcoming the limits of the minimum lithographic feature size and the deficit in the available chip surface space for purposes of pass transistor logic.

Therefore, there is a need in the art to provide improved transistor logic technology which overcomes these barriers.

SUMMARY OF THE INVENTION

The above mentioned problems with pass transistor logic and other problems are addressed by the present invention and will be understood by reading and studying the following specification. Systems and methods are provided for static pass transistor logic having transistors with multiple vertical gates. The multiple vertical gates are edge defined such that only a single transistor is required for multiple logic inputs. Thus a minimal surface area is required for each logic input.

In one embodiment of the present invention, a novel static pass transistor is provided. The novel static pass transistor has a horizontal depletion mode channel region between a single source and drain region. A number of vertical gates are located above different portions of the depletion mode channel region. At least one of the vertical gates is located above a first portion of the depletion mode channel region and is separated from the channel region by a first thickness insulator material. At least one of the vertical gates is located above a second portion of the channel region and is separated from the channel region by a second thickness insulator material.

The techniques described here produce logic gates where each logic input is less that one transistor. In a conventional NMOS NAND logic circuit each logic input goes to the gate of a separate transistor each with a source, drain and gate, here there is no source nor drain region associated with each input and the gates have sub-lithographic horizontal dimensions by virtue of being edge defined vertical gates. This results in a minimal area being associated with each logic input.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE INVENTION

Figure 1A:
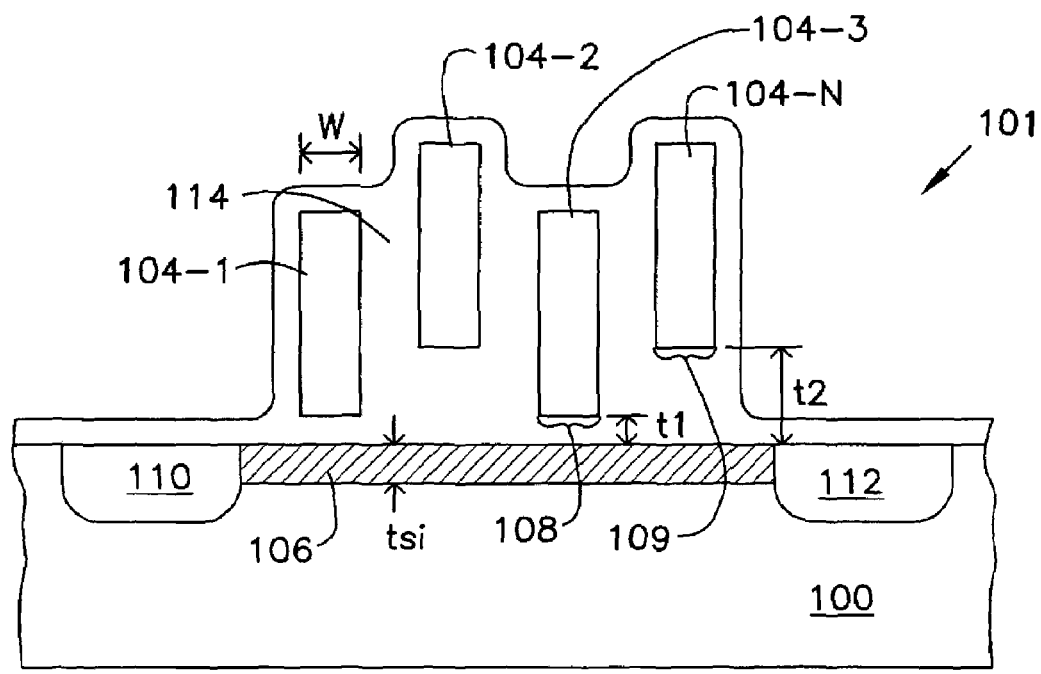
FIG. 1A illustrates a novel static pass transistor according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

According to the teachings of the present invention, a pass transistor logic is described where transistors with multiple vertical gates are employed in static CMOS combinational logic circuits. The pass transistors are similar to a regular series connection of individual transistors except here because of the close proximity of the gates of address lines separate and individual source/drain regions are not required between the gates. An implanted depletion mode channel serves to form the conductive region not only under each gate region but also between different gate regions.

FIG. 1A illustrates a novel static pass transistor 101 according to the teachings of the present invention. As shown in FIG. 1A, the static pass transistor 101 includes a source region 110 and a drain region 112 in a horizontal substrate 100. A depletion mode channel region 106 separates the source region 110 and the drain region 112. A number of vertical gates 104-1, 104-2, . . . , 104-N, are located above different portions of the depletion mode channel region 106. According to the teachings of the present invention, the number of vertical gates 104-1, 104-2, . . . , 104-N, are edge defined vertical gates such that each of the number of vertical gates 104-1, 104-2, . . . , 104-N, has a horizontal width (W) which is sub-lithographic in dimension. In one embodiment, each of the number of vertical gates 104-1, 104-2, . . . , 104-N, has a horizontal width of approximately 100 nanometers (nm). According to one embodiment of the present invention, the number of vertical gates 104-1, 104-2, . . . , 104-N, includes a number of polysilicon vertical gates 104-1, 104-2, . . . , 104-N. At least one of the vertical gates, e.g. vertical gate 104-3, is located above a first portion 108 of the depletion mode channel region 106 and is separated from the depletion mode channel region 106 by a first thickness insulator material (t1). In one embodiment, the first thickness insulator material (t1) includes a first oxide thickness (t1). At least one of the vertical gates, e.g. vertical gate 104-N, is located above a second portion 109 of the depletion mode channel region 106 and is separated from the depletion mode channel region 106 by a second thickness insulator material (t2). In one embodiment, the second thickness insulator material (t2) includes a second oxide thickness (t2). As shown in FIG. 1A, the second oxide thickness (t2) is greater than the first oxide thickness (t1). In one embodiment, the first oxide thickness (t1) is less than 50 Angstroms (Å) and the second oxide thickness (t2) is less than 150 Angstroms (Å). In one embodiment, the first oxide thickness (t1) is approximately 33 Å and the second oxide thickness (t2) is approximately 100 Å.

As shown in FIG. 1A, the number of vertical gates 104-1, 104-2, . . . , 104-N, are parallel and opposing one another. The number of vertical gates 104-1, 104-2, . . . , 104-N, are separated from one another by an intergate dielectric 114. In one embodiment, the intergate dielectric 114 includes silicon dioxide ($SiO_2$). In one embodiment, the number of vertical gates 104-1, 104-2, . . . , 104-N, have a vertical height of approximately 500 nanometers (nm). Also, in one embodiment of the present invention, the horizontal depletion mode channel has a depth (tsi) in the horizontal substrate of approximately 400 Å. According to the teachings of the present invention, the number of vertical gates 104-1, 104-2, . . . , 104-N, serve as logic inputs 104-1, 104-2, . . . , 104-N, for the static pass transistor 101.

Figure 1B:
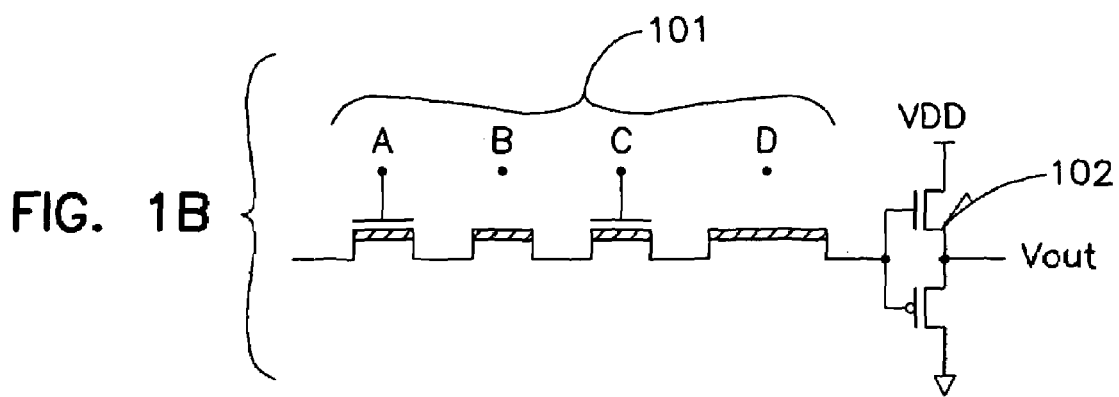
FIG. 1B is a schematic illustration of the novel static pass transistor shown in FIG. 1A.

FIG. 1B is a schematic illustration of the novel static pass transistor shown in FIG. 1A. The schematic of FIG. 1B shows the number of vertical gates 104-1, 104-2, . . . , 104-N, as multiple conductive nodes A, B, C, and D above the horizontal depletion mode channel. An independent potential can be applied to each of the conductive nodes A, B, C, and D. Conductive nodes A and C are represented as gates since they are separated from the depletion mode channel by the first oxide thickness. Conductive nodes B and D are shown just as nodes since they are separated from the depletion mode channel by the second oxide thickness. The static pass transistor 101 is further shown coupled to a buffer mode amplifier 102 to provide gain. The channel is uniformly depletion mode or normally "on" and can conduct with zero potential applied to the conductive nodes A, B, C, and D. In operation, the conductive nodes A and C serve as multiple logic inputs, or active inputs, and can effect conduction in the depletion mode channel. Conductive nodes B and D, on the other hand cannot effect conduction in the depletion mode channel because they are further distanced from the depletion mode channel by the second oxide thickness. In other words, conductive nodes B and D have no control over the depletion mode channel and can not turn the depletion mode channel "off." Conductive nodes B and D thus function as passing lines over the depletion mode channel. In one operation embodiment, if a negative potential is applied to either of the conductive nodes A and C this negative potential works to turn "off" a portion of the depletion mode channel beneath that particular conductive node or gate. In one operation embodiment, a negative potential of approximately −0.6 Volts applied to either conductive node A or C will block conduction in the depletion mode channel. On the other hand, if conductive nodes A and C both have an applied potential of approximately zero Volts then the novel static pass transistor 101 conducts. Thus, in this embodiment, the novel static pass transistor 101 operates as a two input positive logic NAND gate. The conductive nodes A, B, C, and D make up a logic chain. And, the novel static pass transistor can function with an operating voltage range of approximately +/−0.5 Volts.

Figure 1C:
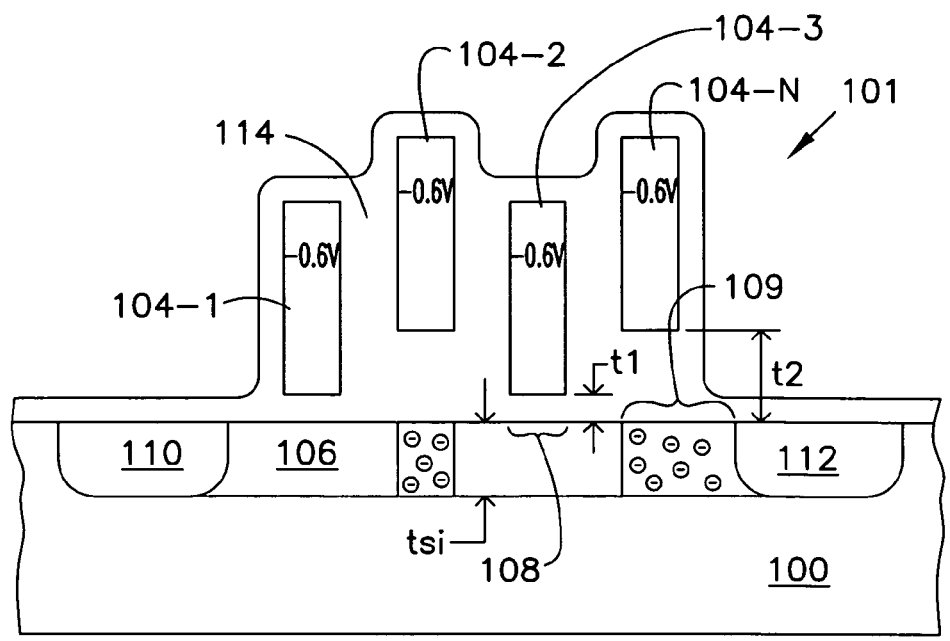
FIG. 1C is an illustration of the operation of the novel static pass transistor described in connection with FIGS. 1A and 1B.

FIG. 1C is an illustration of the operation of the novel static pass transistor described in connection with FIGS. 1A and 1B. FIG. 1C shows four vertical gates 104-1, 104-2, 104-3, and 104-4 formed of heavily doped n+ type polysilicon. The four vertical gates 104-1, 104-2, 104-3, and 104-4 are located above a horizontal depletion mode channel 106 which separates heavily doped n+ type source and drain regions, 110 and 112 respectively. The horizontal depletion mode channel includes a lightly doped n type channel. In FIG. 1C, a independent potential of −0.6 Volts is applied to each of the four vertical gates 104-1, 104-2, 104-3, and 104-4. Vertical gates 104-1 and 104-3 are separated by a first oxide thickness (t1) from the depletion mode channel which is less than a second oxide thickness (t2) separating vertical gates 104-2 and 104-4 from the depletion mode channel. Thus, the negative potential on vertical gates 104-1 and 104-3 turns off conduction in that portion of the depletion mode channel beneath those vertical gates as shown in FIG. 1C. By contrast, the negative potential on vertical gates 104-2 and 104-4 does not control or effect conduction in the depletion mode channel.

Figure 1D:
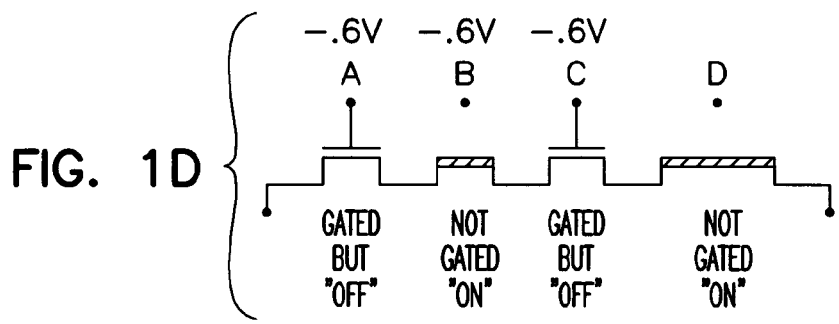
FIG. 1D is another characterization of the novel static pass transistor of FIG. 1C.
Figure 1E:
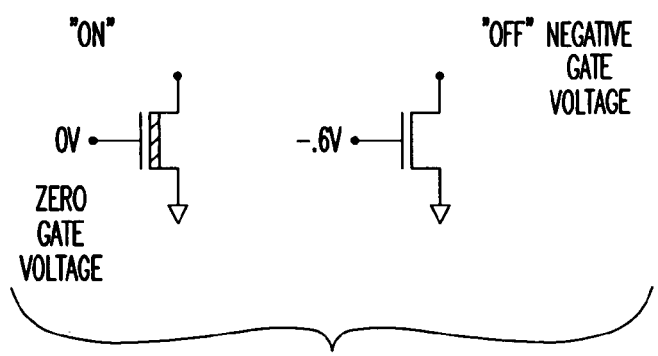
FIG. 1E is a further illustration showing that depletion mode n-channel MOSFETs are "on" with zero gate voltage and that a negative applied gate voltage turns "off" the depletion mode n-channel.

FIG. 1D is another characterization of the novel static pass transistor of FIG. 1C. Conductive nodes A, B, C, and D represent the four vertical gates 104-1, 104-2, 104-3, and 104-4. The regions beneath conductive nodes A and C with their negative applied potentials can be characterized as "gated," but "off." The regions beneath conductive nodes B and D with their negative applied potentials can be characterized as "not gated," or "on" since these conductive nodes are separated from the depletion mode channel by the thicker second oxide thickness. Conductive node B and D thus function as passing lines. FIG. 1E is a further illustration showing that depletion mode n-channel MOSFETs are "on" with zero gate voltage and that a negative applied gate voltage turns "off" the depletion mode n-channel. In one embodiment, the threshold voltage (Vt) required to turn "off" the depletion mode n-channel is approximately −0.6 Volts.

Figure 2A:
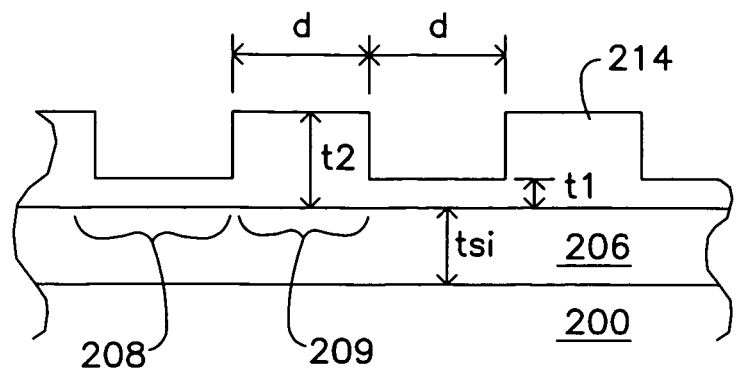
FIG. 2A illustrates one embodiment for the variance between the first oxide thickness (t1) and the second oxide thickness (t2) in the novel static pass transistor of the present invention.
Figure 2B:
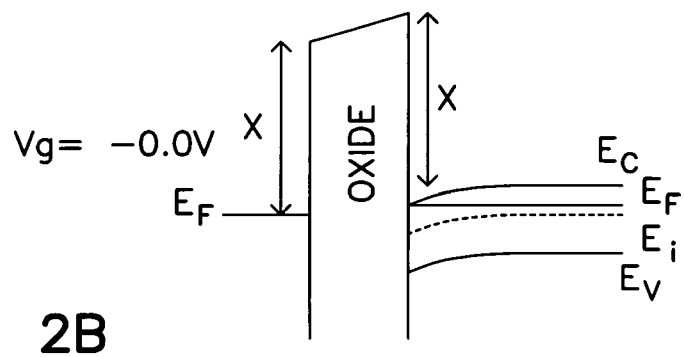
FIG. 2B is an energy band diagram illustrating the effect on the conduction in the depletion mode channel beneath the first oxide thickness (t1) when a zero Volts gate potential (Vg) is applied above according to one embodiment of the present invention.
Figure 2C:
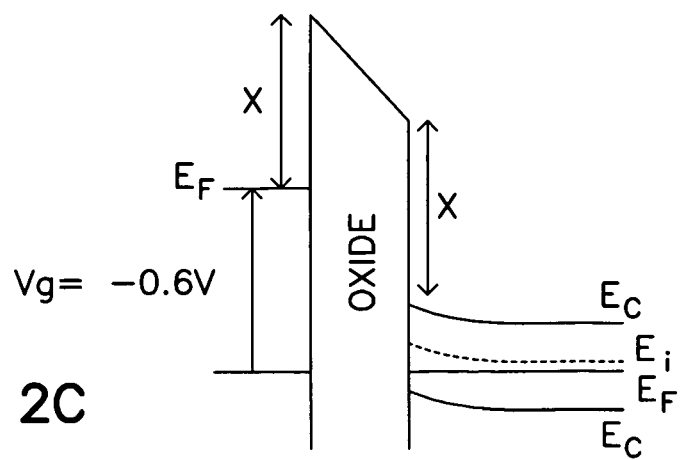
FIG. 2C is an energy band diagram illustrating the effect on the conduction in the depletion mode channel beneath the first oxide thickness (t1) with a negative applied gate potential (Vg) of approximately −0.6 Volts.

FIGS. 2A–2C illustrate an operating voltage range for the novel static pass transistor of the present invention for certain values of a first oxide thickness (t1) and a second oxide thickness (t2). FIG. 2A illustrates one embodiment for the variance between the first oxide thickness (t1) and the second oxide thickness (t2). As shown in FIG. 2A, the first oxide thickness (t1) and the second oxide thickness (t2) are located above a horizontal depletion mode channel 206. In the embodiment shown in FIG. 2A, first oxide thickness (t1) is less than the second oxide thickness (t2). In one embodiment, the first oxide thickness (t1) is approximately 33 Å and the second oxide thickness is approximately 100 Å. As shown in FIG. 2A, the depletion mode channel extends a thickness (tsi) into the horizontal substrate. In one embodiment, the thickness (tsi) is between 100 to 1000 Å. In one embodiment, the thickness (tsi) is approximately 400 Å. For purposes of illustration, the doping concentration (Nd) in this embodiment is approximately $6.25 \times 10^{17}$ atoms/cm$^3$. The capacitance of the oxide (Cox) can be calculated as by dividing the electric permittivity of oxide (approximately $0.353 \times 10^{-12}$ Farads/cm) by the thickness of the oxide. An oxide capacitance (Cox) for the thin or first oxide thickness (t1) of 33 Å is approximately $(0.353 \times 10^{-12}$ Farads/cm)/$(33 \times 10^{-8}$ cm) or approximately $10^{-6}$ Farads/cm. The charge Qb in the horizontal depletion mode channel is (q)×(Nd)× (tsi), or approximately $0.4 \times 10^{-6}$ Coulombs/cm$^2$. The bulk charge over the oxide capacitance for the thin or first thickness oxide (t1) can be stated as V=Qb/Cox or approximately 0.4 Volts. On the other hand the bulk charge over the oxide capacitance for the thicker or second oxide thickness (t2) of approximately 100 Å will be significantly greater.

FIG. 2B is an energy band diagram illustrating the effect on the conduction in the depletion mode channel beneath the first oxide thickness (t1) when a zero Volts gate potential (Vg) is applied above. As shown in FIG. 2B, when zero (0.0) Volts are applied to a gate (Vg) above the first oxide thickness (t1) the Fermi level (Ef) in the silicon channel will be approximately 0.4 Volts, above the intrinsic level (Ei). In other words, since the horizontal depletion mode channel is doped the Fermi level (Ef) in the channel is above that for intrinsic silicon (Ei), e.g. 0.35 Volts, and closer to the conduction band (Ec). From the illustrative calculations provided above in connection with FIG. 2A the Fermi level (Ef) in the channel is approximately 0.4 Volts. Thus, for a zero Volts gate potential (Vg) the Fermi levels (Ef) in the polysilicon gate and the channel are approximately aligned and conduction will occur in the horizontal depletion mode channel.

FIG. 2C is an energy band diagram illustrating the effect on the conduction in the depletion mode channel beneath the first oxide thickness (t1) when a negative gate potential (Vg) of approximately −0.6 Volts is applied above. As shown in FIG. 2C, an applied gate potential (Vg) of a negative −0.6 Volts will raise the Fermi level in a polysilicon vertical gate and suppress the Fermi level in the doped channel beneath the first oxide thickness (t1) to even with or below the Fermi level value for intrinsic silicon such that the Fermi level in the channel is then closer to the valence band (Ev) in the channel. In this state no conduction will occur in this portion of the channel and the channel is turned "off." Thus, an applied potential of approximately a negative −0.6 Volts, accounting for a work function difference of approximately a negative −0.2 Volts and other variables involved such as an oxide charge if any, will be sufficient to overcome the bulk charge over the oxide capacitance (e.g. 0.4 V) across the thin or first thickness oxide (t1) of approximately 33 Å. The negative −0.6 Volts gate potential can thus turn "off" the normally "on" depletion mode channel. In other words, according to the teachings of the present invention, the novel static pass transistor can operate with an operating voltage range of approximately half a Volt (0.6 V)

Figure 3A:
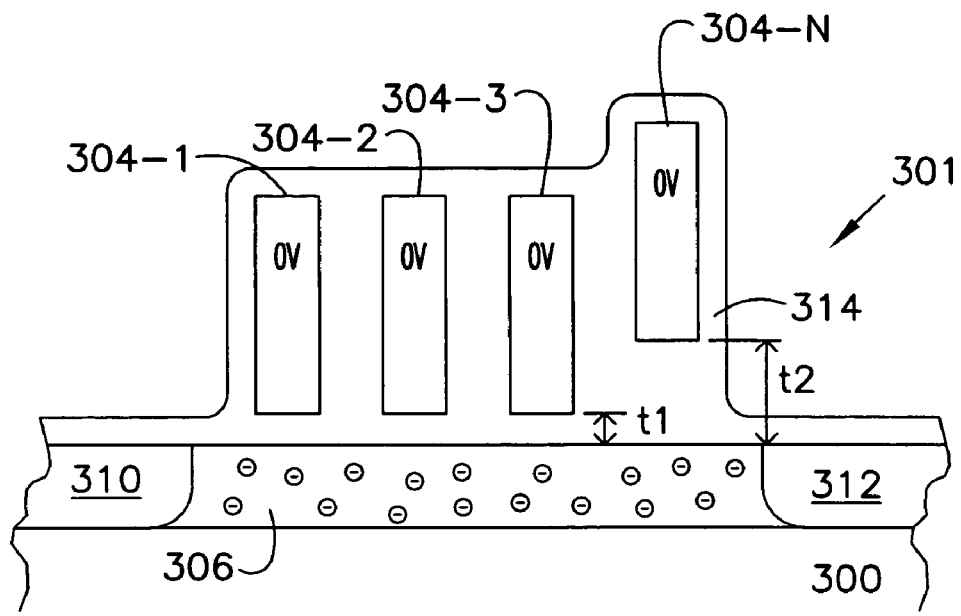
FIG. 3A is an illustration of another embodiment configuration for the novel static pass transistor of the present invention.

FIG. 3A is an illustration of another embodiment configuration for the novel static pass transistor of the present invention. In other words, FIG. 3A shows a different "input" configuration and the conductivity or resistance of the depletion mode channel with different input voltages. FIG. 3A shows four vertical gates 304-1, 304-2, 304-3, and 304-4 formed of heavily doped n+ type polysilicon. The four vertical gates 304-1, 304-2, 304-3, and 304-4 are located above a horizontal depletion mode channel 306 which separates heavily doped n+ type source and drain regions, 310 and 312 respectively. The horizontal depletion mode channel includes a lightly doped n type channel. In the operational embodiment of FIG. 3A, an independent potential of zero Volts is applied to vertical gates 304-1, 304-2, and 304-3. An independent potential of −0.6 Volts is applied to vertical gate 304-4. Vertical gates 304-1, 304-2, and 304-3 are separated by a first oxide thickness (t1) from the depletion mode channel 306 which is less than a second oxide thickness (t2) separating vertical gate 304-4 from the depletion mode channel. As explained and described in detail above, potential applied to vertical gate 304-4 does not control the conduction in the horizontal depletion mode channel due to its separation therefrom by the thicker second oxide thickness. Thus, the negative potential on vertical gates 304-4 does not turn off conduction in that portion of the depletion mode channel beneath it. Further, since an independent potential of zero Volts is applied to vertical gates 304-1, 304-2, and 304-3, there is no reduction in the conduction of the depletion mode channel beneath these vertical gates or active inputs either. However, since vertical gates 304-1, 304-2, and 304-3 are active inputs a negative potential applied independently to any one of these gates would turn "off" conduction in that portion of the depletion mode channel beneath it. In other words, these active inputs 304-1, 304-2, and 304-3 can control or effect conduction in the depletion mode channel.

Figure 3B:
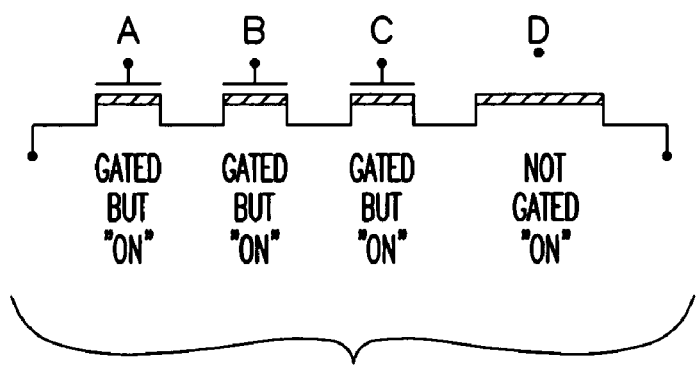
FIG. 3B is another characterization of the novel static pass transistor of FIG. 3A.

FIG. 3B is another characterization of the novel static pass transistor of FIG. 3A. Conductive nodes A, B, C, and D represent the four vertical gates 304-1, 304-2, 304-3, and 304-4. The regions beneath conductive nodes A, B and C with their zero applied potential can be characterized as "gated," but "on." The regions beneath conductive node D with its negative applied potentials can be characterized as "not gated," or "on" since this conductive node is separated from the depletion mode channel by the thicker second oxide thickness. Conductive node D thus functions as a passing line in this embodiment.

Figure 4A:
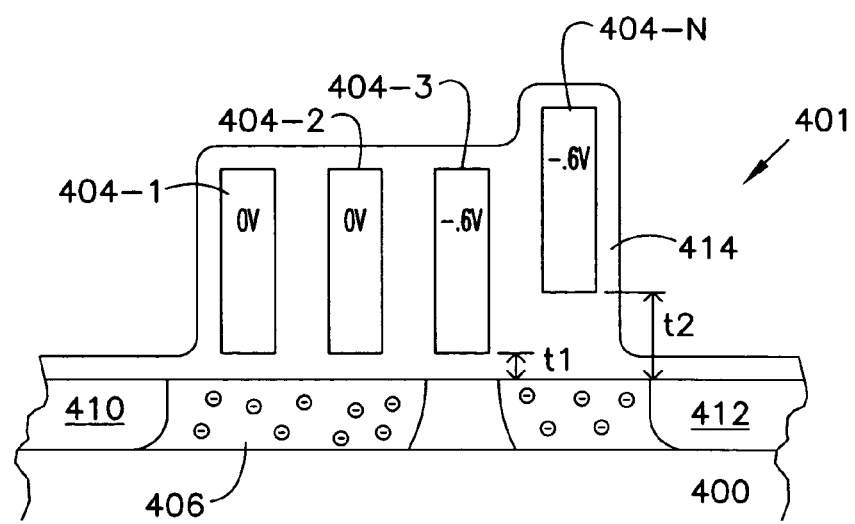
FIG. 4A is an illustration of another operational state for the novel static pass transistor shown in FIGS. 3A and 3B.

FIG. 4A is an illustration of another operational state for the novel static pass transistor shown in FIGS. 3A and 3B. In effect, FIG. 4A shows operation of the novel static pass transistor shown in FIGS. 3A and 3B with different input voltages. FIG. 4A shows four vertical gates 404-1, 404-2, 404-3, and 404-4 formed of heavily doped n+ type polysilicon. The four vertical gates 404-1, 404-2, 404-3, and 404-4 are located above a horizontal depletion mode channel 406 which separates heavily doped n+ type source and drain regions, 410 and 412 respectively. The horizontal depletion mode channel includes a lightly doped n type channel. In the operational embodiment of FIG. 4A, a independent potential of zero Volts is applied to vertical gates 404-1 and 404-2. An independent potential of −0.6 Volts is applied to vertical gates 404-3 and 404-4. Vertical gates 404-1, 404-2, and 404-3 are separated by a first oxide thickness (t1) from the depletion mode channel 406 which is less than a second oxide thickness (t2) separating vertical gate 404-4 from the depletion mode channel. As explained and described in detail above, potential applied to vertical gate 404-4 does not control the conduction in the horizontal depletion mode channel due to its separation therefrom by the thicker second oxide thickness. Thus, the negative potential on vertical gate 404-4 does not turn off conduction in that portion of the depletion mode channel beneath it. Further, since an independent potential of zero Volts is applied to vertical gates 404-1 and 404-2 there is no reduction in the conduction of the depletion mode channel beneath these vertical gates, or active inputs either. However, since vertical gate 404-3 is an active input, the negative potential of −0.6 Volts applied independently to this gate does turn "off" conduction in that portion of the depletion mode channel beneath it.

Figure 4B:
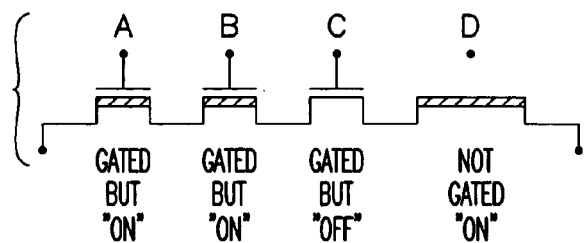
FIG. 4B is another characterization of the novel static pass transistor of FIG. 4A.

FIG. 4B is another characterization of the novel static pass transistor of FIG. 4A. Conductive nodes A, B, C, and D represent the four vertical gates 404-1, 404-2, 404-3, and 404-4. The regions beneath conductive nodes A and B with their zero applied potential can be characterized as "gated," but "on." The region beneath conductive node C with its negative applied potential can be characterized as "gated," and "off." The regions beneath conductive node D with its negative applied potentials can be characterized as "not gated," or "on" since this conductive node is separated from the depletion mode channel by the thicker second oxide thickness. Conductive node D thus functions as a passing line in this embodiment.

Figure 5:
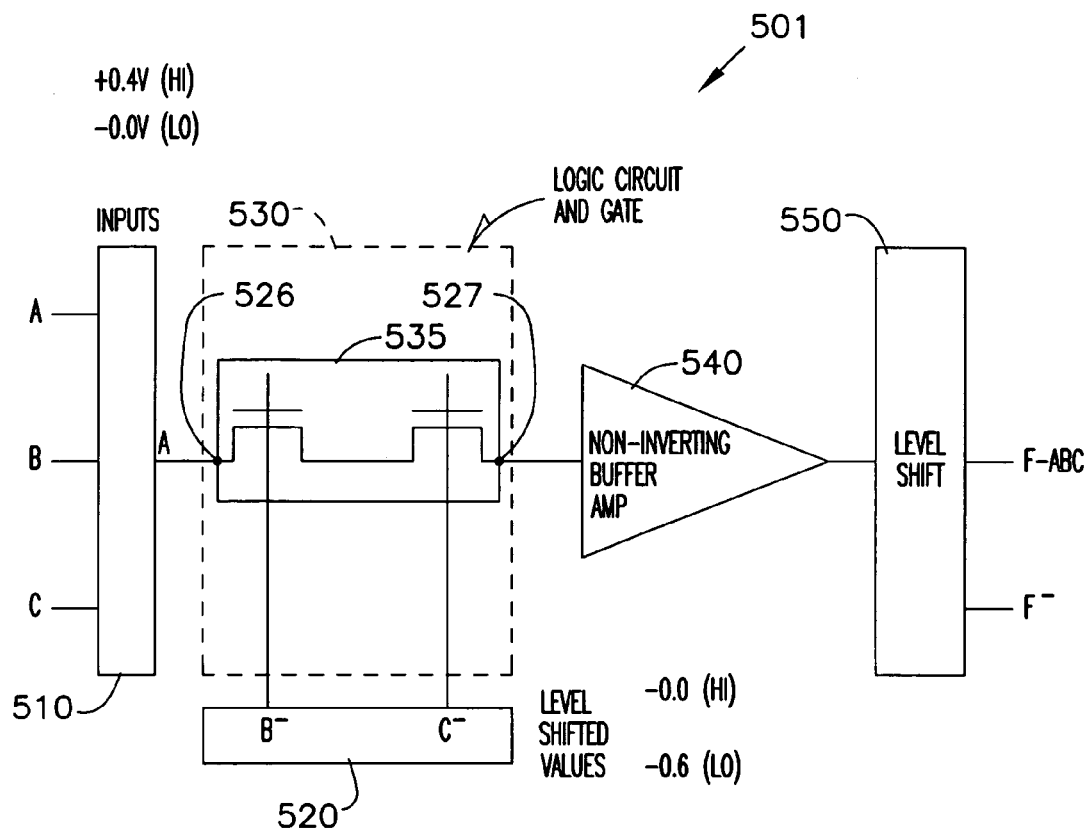
FIG. 5 illustrates an embodiment of the novel static pass transistors of the present invention in a pass transistor logic (PTL) circuit.
Figure 6:
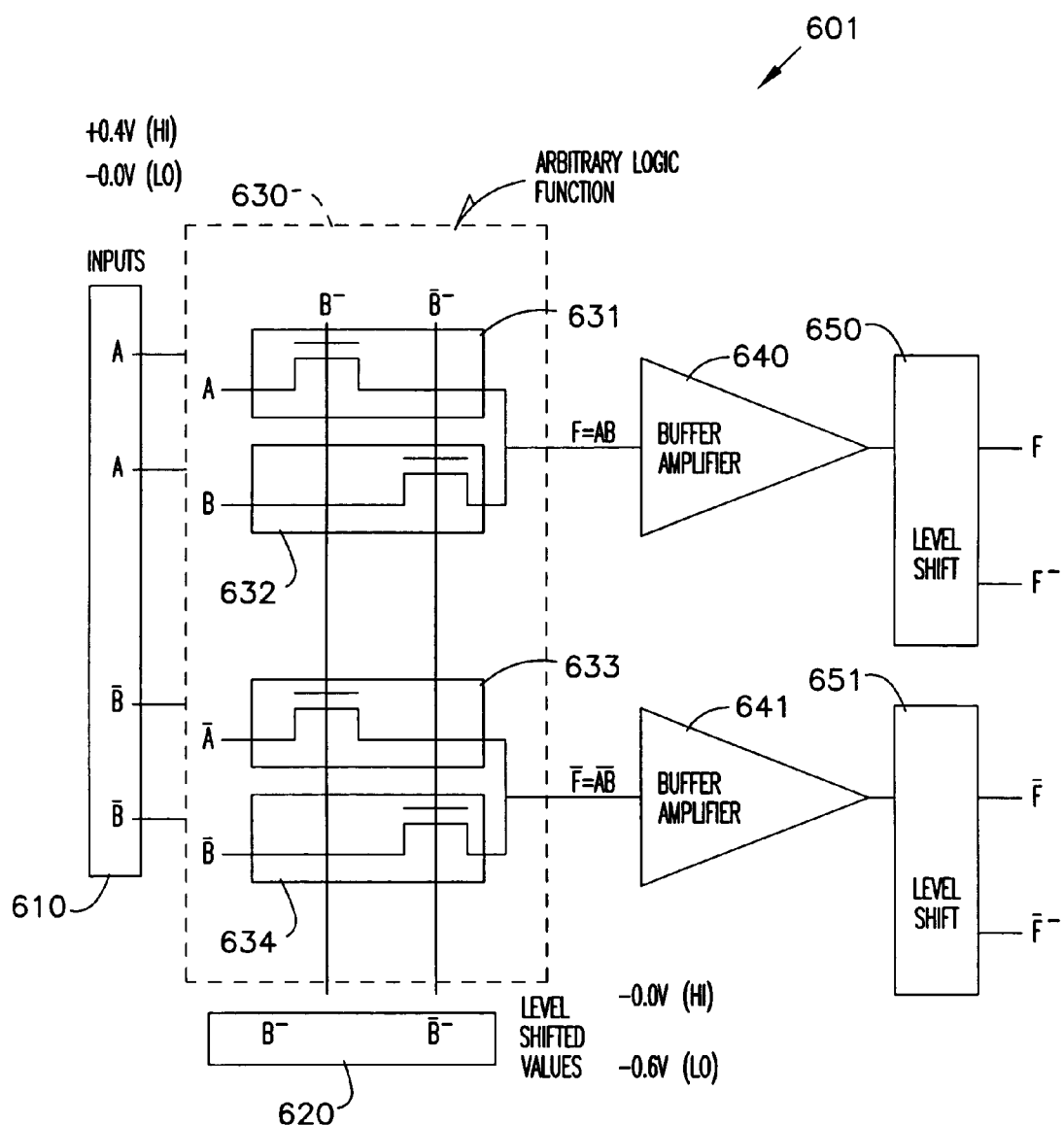
FIG. 6 illustrates a complementary pass transistor logic (CPTL) circuit embodiment employing the novel static pass transistors of the present invention.
Figure 7:
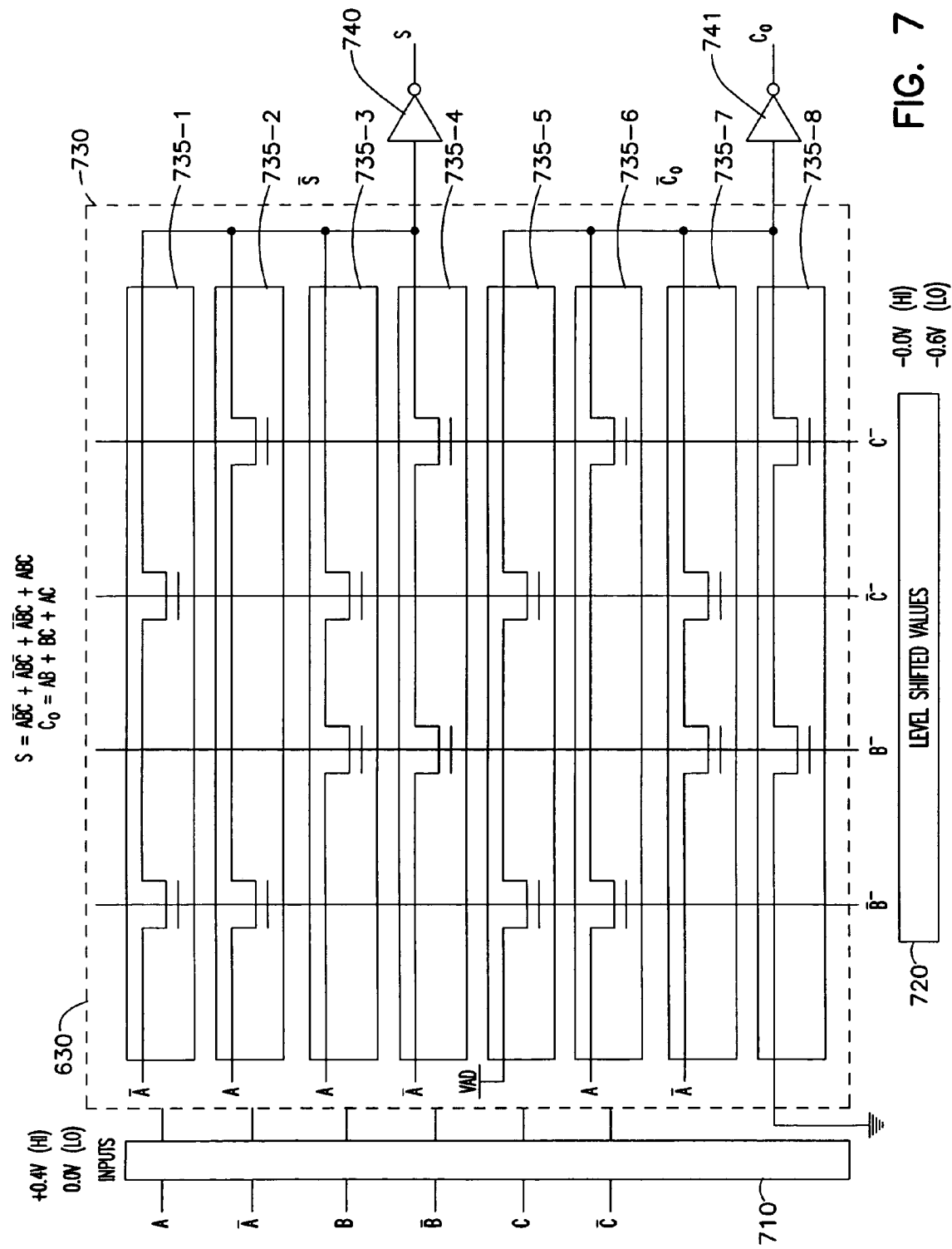
FIG. 7 illustrates a complementary pass transistor logic (CPTL) circuit embodiment for an adder circuit 701 employing the novel static pass transistors of the present invention.

FIGS. 5–7 illustrates an embodiment of several circuits employing the novel static pass transistor logic of the present invention. According to the teachings of one embodiment of the present invention, the horizontal depletion mode channel will be conductive if zero volts is applied to all of the active vertical gates, or logic inputs, over the thin, or first oxide, thickness regions and not conductive if a negative voltage of approximately −0.6 Volts, e.g. an operating voltage range of approximately 0.6 Volts, is applied to any of the active vertical gates. These devices can be employed in both pass transistor logic and complementary pass transistor logic circuits. In doing so, one technique is to have available not only the logic variable, but its complement and level shifted values of both. As an example, the voltage levels for the positive logic one can be +0.4 Volts and the positive logic zero can be 0.0 Volts. The level shifted values, respectively, will be 0.0 Volts and −0.6 Volts. Not all of these values may be needed or required in any specific application.

FIG. 5 illustrates an embodiment of the novel static pass transistors of the present invention in a pass transistor logic (PTL) circuit. An input block with inputs A, B, and C is shown at 510. Inputs A, B, and C will carry high and low inputs, e.g. +0.4 Volts or 0.0 Volts, and couple the high and low inputs to a logic circuit 530 formed according to the teachings of the present invention. As shown in FIG. 5, the invention further includes level shift block 520 which produces level shifted values for the inputs. FIG. 5 illustrates an embodiment where the level shift block produces level shifted values, B− and C−, for the inputs provided on lines B and C. The level shift block 520 couples the level shifted values, B− and C−, to the number of vertical gates 522 and 523 in logic cell 535 which is included in logic circuit 530 according to the teachings of the present invention. One of ordinary skill in the art will understand upon reading this disclosure that logic cell 535 is a representative sample of what can be one or more logic cell in logic circuit 530 to implement a specific logic function according to the teachings of the present invention. FIG. 5 illustrates an embodiment, where input A is the input variable and is provided to a single source region, or node, 526 for logic cell 535. In the embodiment, illustrated in FIG. 5, a single drain region, or node, 527 for logic cell 535 is coupled to a non-inverting buffer amplifier 540. In the embodiment shown in FIG. 5, the non-inverting buffer amplifier is further coupled to another level shift block 550. Thus, in the FIG. 5 embodiment the level shifted values, B− and C−, control conduction in the horizontal depletion mode channel of logic cell 535. If the input value of A is high, e.g. +0.4 Volts, and the level shifted values of B and C are high, e.g. 0.0 Volts, then the pass transistor, or logic cell 535, will conduct and the positive logic AND circuit performed.

FIG. 6 illustrates a complementary pass transistor logic (CPTL) circuit embodiment employing the novel static pass transistors of the present invention. The embodiment shown in FIG. 6 includes an input block 610 with inputs A and B and their complements A̅ and B̅. Again, inputs A and B and their complements A̅ and B̅ will carry high and low inputs, e.g. +0.4 Volts or 0.0 Volts, and couple the high and low inputs to a logic circuit 630 formed according to the teachings of the present invention. As shown in FIG. 6, the invention further includes level shift block 620 which produces level shifted values for the inputs. FIG. 6 illustrates an embodiment where the level shift block produces level shifted values, B− and B̅−, for the inputs provided on lines B and B̅. The level shift block 620 couples the level shifted values, B− and B̅−, to the number of vertical gates in logic cells 631–634 which are included in logic circuit 630 according to the teachings of the present invention. One of ordinary skill in the art will understand upon reading this disclosure that the logic cells 631–634 are representative samples the variety of logic cell structures formed according to the teachings of the present invention with some of the vertical gates in each logic cell being formed over a thin gate oxide and serving as active inputs and others being formed over thicker gate oxides and serving as passing lines in order to implement a specific logic function. FIG. 6 illustrates an embodiment, where inputs A and B and their complements A̅ and B̅ are the input variables and where each is provided to a single source region, or node, for logic cells 631–634. In the embodiment shown in FIG. 6, single drain regions, or nodes, for logic cells 631 and 632 are coupled together and provided to a buffer amplifier 640. Also, single drain regions, or nodes, for logic cells 633 and 634 are coupled together and provided to a buffer amplifier 641. In the embodiment shown in FIG. 6, the buffer amplifiers 640 and 641 each are further coupled to level shift blocks 650 and 651, respectively. Thus, in the FIG. 6 embodiment the level shifted values, B− and B̅−, control conduction in the horizontal depletion mode channel of logic cells 631–634. If in a given combination, an input value of A, B, A̅ and/or B̅ are high, e.g. +0.4 Volts, and the level shifted values of B− or B̅− connected to an active input for the given logic cell among 631–634 is high, e.g. 0.0 Volts, then the pass transistor, or logic cell among 631–634, will conduct. As one of ordinary skill in the art will understand upon reading this disclosure, the logic function in logic circuit block 630 can be any arbitrary logic function. In the embodiment shown in FIG. 6, the logic function illustrated is an AND/NAND function. In other words, the inputs on left, e.g. A, B, $\overline{A}$ and/or $\overline{B}$, will not pass through a given logic cell among 631–634 in logic circuit block 630 unless the level shifted values B− or $\overline{B}$− connected to the active gates of the given logic cell are high, e.g. 0.0 Volts in this embodiment.

FIG. 7 illustrates a complementary pass transistor logic (CPTL) circuit embodiment for an adder circuit 701 employing the novel static pass transistors of the present invention. The embodiment shown in FIG. 7 includes an input block 710 with inputs A, B, and C and their complements $\overline{A}$, $\overline{B}$ and $\overline{C}$. Again, inputs A, B, and C and their complements $\overline{A}$, $\overline{B}$ and $\overline{C}$ will carry high and low inputs, e.g. +0.4 Volts or 0.0 Volts, and couple the high and low inputs to a logic circuit block 730 including a number of logic cells, 735-1, 735-2, . . . , 735-N, formed according to the teachings of the present invention. As one of ordinary skill in the art will understand upon reading this disclosure, any number of logic cells can be included in logic circuit block 730 to implement a variety of logic functions. As shown in FIG. 7, the invention further includes level shift block 720 which produces level shifted values for the inputs. FIG. 7 illustrates an embodiment where the level shift block produces level shifted values, B−, $\overline{B}$−, C− and $\overline{C}$−, for the inputs provided on lines B, $\overline{B}$, C and $\overline{C}$. The level shift block 720 couples the level shifted values, B−, $\overline{B}$−, C− and $\overline{C}$−, to the number of vertical gates in logic cells, 735-1, 735-2, . . . , 735-N, which are included in logic circuit 730 according to the teachings of the present invention. One of ordinary skill in the art will understand upon reading this disclosure that the logic cells, 735-1, 735-2, . . . , 735-N, are representative samples of the variety of logic cell structures formed according to the teachings of the present invention with some of the vertical gates in each logic cell being formed over a thin gate oxide and serving as active inputs and others being formed over thicker gate oxides and serving as passing lines in order to implement a specific logic function. Further, any number of logic cells, 735-1, 735-2, . . . , 735-N, can be included. In the embodiment shown in FIG. 7, each of the logic cells, 735-1, 735-2, . . . , 735-N, include four vertical gates or logic inputs some of which are active inputs represented with gates, others function only as passing lines. One of ordinary skill in the art will understand that any number of vertical gates or logic inputs can be included in each logic cell, 735-1, 735-2, . . . , 735-N, depending on the number of inputs provided.

FIG. 7 illustrates an embodiment, where input A its complements $\overline{A}$ are the input variables and where each is provided to a number of source regions, or nodes, among logic cells, 735-1, 735-2, . . . , 735-N. In the embodiment shown in FIG. 7, drain regions, or nodes, for logic cells, 735-1 through 735-4, are coupled together and provided to a buffer amplifier 740. Also, drain regions, or nodes, for logic cells, 735-5 through 735-8 are coupled together and provided to a buffer amplifier 741. Thus, in the FIG. 7 embodiment the level shifted values, B−, $\overline{B}$−, C− and $\overline{C}$−, control conduction in the horizontal depletion mode channel of logic cells, 735-1, 735-2, . . . , 735-N. If in a given combination, an input value of A or $\overline{A}$ is high, e.g. +0.4 Volts, and the level shifted values of B−, $\overline{B}$−, C− and/or $\overline{C}$− connected to an active input for the given logic cell among, 735-1, 735-2, . . . , 735-N is high, e.g. 0.0 Volts, then the pass transistor, or logic cell among 735-1, 735-2, . . . , 735-N will conduct. As one of ordinary skill in the art will understand upon reading this disclosure, the logic function in logic circuit block 730 can be any arbitrary logic function. In general the novel adder circuit 701 can be constructed to have all input variables and their complements and level shifted values of each available. In the embodiment shown in FIG. 7, however, only the input value of input line A and its complement $\overline{A}$ are required at the source regions, or nodes, for the number of logic cells 735-1, 735-2, . . . , 735-N and only level shifted values of B−, $\overline{B}$−, C− and $\overline{C}$− are required for the vertical gates, or logic inputs. The inputs on the left, e.g. A and $\overline{A}$ will not pass through a given logic cell among 735-1, 735-2, . . . , 735-N in logic circuit block 730 unless each of the level shifted values B−, $\overline{B}$−, C− and/or $\overline{C}$− connected to the active gates in that given cell are high, e.g. 0.0 Volts in this embodiment.

Figure 8A:
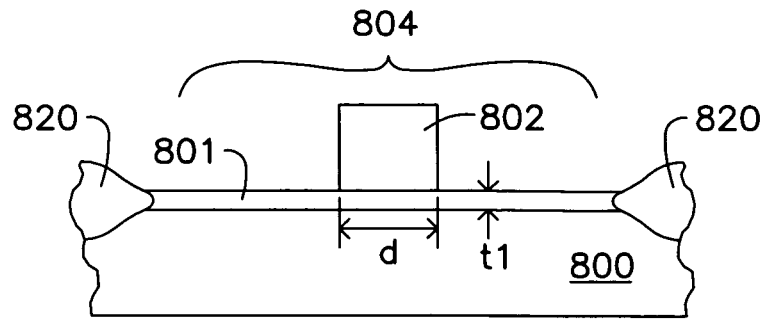
FIGS. 8A–8F illustrate one method for forming the novel static pass transistors of the present invention.

FIGS. 8A–8E illustrate one method for forming the novel static pass transistors of the present invention. FIG. 8A illustrates the structure after the first sequence of processing steps. In FIG. 8A, a thin gate oxide 801 is formed over an active device area 804, between a pair of field isolation oxides (FOXs) 820, in a horizontal surface of a substrate 800. The thin gate oxide 801 is formed to a first oxide thickness (t1). In one embodiment, the thin gate oxide 801 is formed to a thickness (t1) of less than 50 Angstroms (Å). In one embodiment, the thin gate oxide 801 is formed to a thickness (t1) of approximately 33 Angstroms (Å). One of ordinary skill in the art will understand upon reading this disclosure the various suitable manners in which a thin gate oxide 801 can be formed over the active device area 804. For example, in one embodiment, the thin gate oxide can be formed by thermal oxidation, and the FOXs can be formed using local oxidation of silicon (LOCOS) as the same are known and understood by one of ordinary skill in the art. After growth of the thin gate oxide 801 by thermal oxidation, and the LOCOS isolation 820, a thick layer of sacrificial oxide 802 is deposited over the surface of the thin gate oxide 801. In one embodiment, the thick layer of sacrificial oxide 802 is deposited to a thickness of approximately 0.5 micrometers ($\mu$m) using a low-pressure chemical vapor deposition (LPCVD) technique. Using a photoresist mask, according to photolithography techniques which are known and understood by one of ordinary skill in the art, this thick oxide 802 is etched. Using a photoresist mask this thick oxide 802 is etched, to a horizontal dimension size which is about, d, where, d, is the minimum process dimension. The dimension, d, is the smallest dimension which can be defined by the applicable photolithography techniques. The desired thin-oxide 801 can be regrown in the areas not covered by the remaining thick sacrificial oxide 802. According to one embodiment of the present invention, an inductively coupled plasma reactor (ICP) using $CHF_3$ may be employed for this etching as the same is disclosed in an article by N. R. Rueger et al., entitled "Selective etching of $SiO_2$ over polycrystalline silicon using $CHF_3$ in an inductively couples plasma reactor", J. Vac. Sci. Technol., A, 17(5), p. 2492–2502, 1999. Alternatively, a magnetic neutral loop discharge plasma can be used to etch the thick oxide 802 as disclosed in an article by W. Chen et al., entitled "Very uniform and high aspect ratio anisotropy $SiO_2$ etching process in magnetic neutral loop discharge plasma", ibid, p.

2546–2550. The latter is known to increase the selectivity of SiO$_2$ to photoresist and/or silicon. The structure is now as appears in FIG. 8A.

Figure 8B:
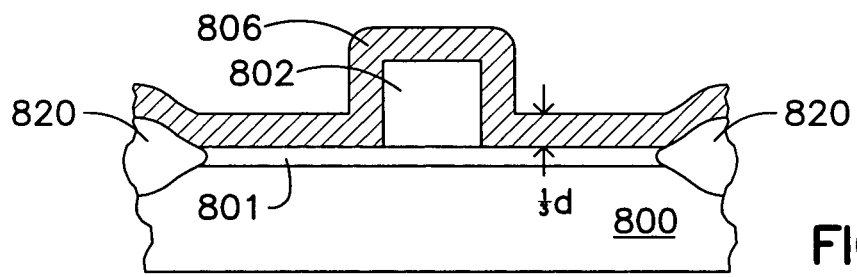

FIG. 8B illustrates the structure following the next sequence of fabrication steps. In FIG. 8B, a polysilicon layer 806 is deposited to a thickness of approximately ⅓d. A conventional chemical vapor deposition (CVD) reactor may be used to deposit polycrystalline silicon films at substrate temperature in excess of 650° Celsius (C.). In an alternative embodiment, a plasma-enhanced CVD process (PECVD) can be employed if a lower thermal budget is desired. In another alternative embodiment, a microwave-excited plasma enhanced CVD of poly-silicon using SiH$_4$/Xe at temperature as low as 300° C. can be performed to deposit the polysilicon layer 406 as disclosed by Shindo et al., ibid. p. 3134–3138. According to this process embodiment, the resulting grain size of the polysilicon film was measured to be approximately 25 nm. Shindo et al. claim that the low-energy (approximately 3 eV), high-flux, ion bombardment utilizing Xe ions on a growing film surface activates the film surface and successfully enhances the surface reaction/migration of silicon, resulting in high quality film formation at low temperatures. In another alternative embodiment, the polysilicon layer 806 can be formed at an even lower temperature, e.g. 150° C., with and without charged species in an electron cyclotron resonance (ECR) plasma-enhanced CVD reactor as disclosed in an article by R. Nozawa et al., entitled "Low temperature polycrystalline silicon film formation with and without charged species in an electron cyclotron resonance SiH$_4$ plasma-enhanced chemical vapor deposition", ibid, p. 2542–2545. In this article, R. Nozawa et al. describe that in using an atomic force microscope they found that the films formed without charged species were smoother than those films formed with charged species. According to the teachings of the present invention, it is important to keep the smoothness of poly-silicon layer 806. This will be evident from reading the subsequently described process steps in which another polysilicon layer will be fabricated later onto polysilicon layer 806 with a very thin insulation layer between them. The structure is now as appears in FIG. 8B.

Figure 8C:
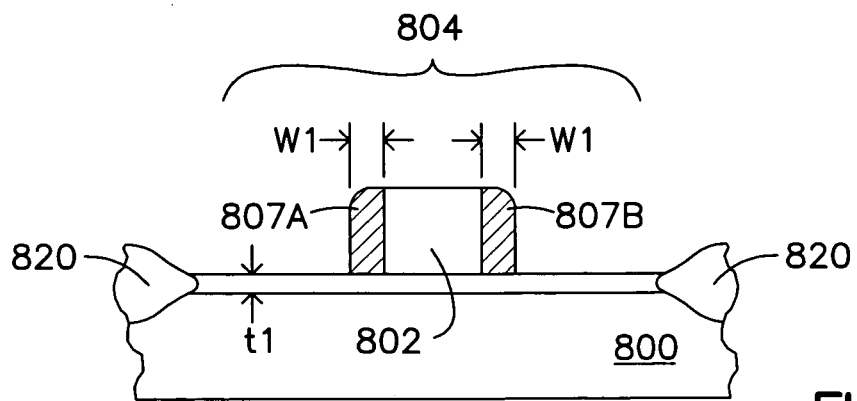

FIG. 8C illustrates the structure following the next sequence of processing steps. FIG. 8C shows a cross section of the resulting vertical gate structures, 807A and 807B, over the active device area 804 after the polysilicon layer 806 has been anisotropically etched. As shown in FIG. 8C, the polysilicon vertical gate structures, 807A and 807B, remain only at the sidewalls of the thick sacrificial oxide 802. In one embodiment, the polysilicon layer 806 is anisotropically etched such that the vertical gate structures, 807A and 807B remaining at the sidewalls of the thick sacrificial oxide 802 have a horizontal width (W1) of approximately 100 nanometers (nm). In one embodiment, the polysilicon layer 806 can be anisotropically etched to form the vertical gate structures, 807A and 807B, through the use of a high-density plasma helicon source for anisotropic etching of a dual-layer stack of poly-silicon on Si$_{1-x}$Ge$_x$ as described in an article by Vallon et al., entitled "Poly-silicon-germanium gate patterning studies in a high density plasma helicon source", J. Vac. Sci. technol., A, 15(4), p. 1874–80, 1997. The same is incorporated herein by reference. In this article, wafers were described as being etched in a low pressure, high density plasma helicon source using various gas mixtures of Cl$_2$, HBr, and O$_2$. Also, according to this article, process conditions were optimized to minimize the gate oxide 801 consumption. The structure is now as shown in FIG. 8C.

Figure 8D:
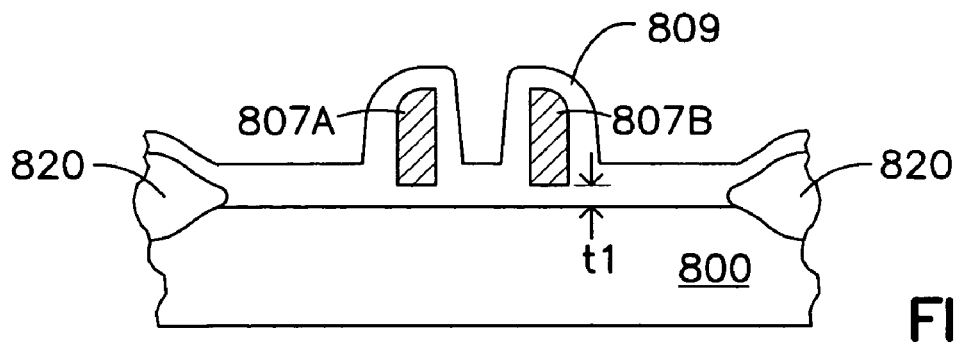

FIG. 8D illustrates the structure after the next series of process steps. In FIG. 8D, the thick sacrificial oxide 802 is removed. As one of ordinary skill in the art will understand upon reading this disclosure the thick sacrificial oxide layer 802 can be removed using any suitable, oxide selective etching technique. As shown in FIG. 8D, the remaining polysilicon vertical gate structures, 807A and 807B, are oxidized to form insulator, intergate dielectric, oxide layer, or silicon dioxide (SiO$_2$) layer 809. In one embodiment, a conventional thermal oxidation of silicon may be utilized at a high temperature, e.g. greater than 900° C. In an alternative embodiment, for purposes of maintaining a low thermal budget for advanced ULSI technology, a lower temperature process can be used. One such low temperature process includes the formation of high-quality silicon dioxide films by electron cyclotron resonance (ECR) plasma oxidation at temperature as low as 400° C. as described in an article by Landheer, D. et al., entitled "Formation of high-quality silicon dioxide films by electron cyclotron resonance plasma oxidation and plasma-enhanced chemical vapor deposition", Thin Solid Films, vol. 293, no. 1–2, p. 52–62, 1997. The same is incorporated herein by reference. Another such low temperature process includes a low temperature oxidation method using a hollow cathode enhanced plasma oxidation system as described in an article by Usami, K. et al., entitled "Thin Si oxide films for MIS tunnel emitter by hollow cathode enhanced plasma oxidation", Thin Solid Films, vol. 281–282, no. 1–2, p. 412–414, 1996. The same is incorporated herein by reference. Yet another low temperature process includes a low temperature VUV enhanced growth of thin silicon dioxide films at low temperatures below 400° C. as described in an article by Patel, P. et al., entitled "Low temperature VUV enhanced growth of thin silicon dioxide films", Applied Surface Science, vol. 46, p. 352–6, 1990. The same is incorporated herein by reference.

Figure 8E:
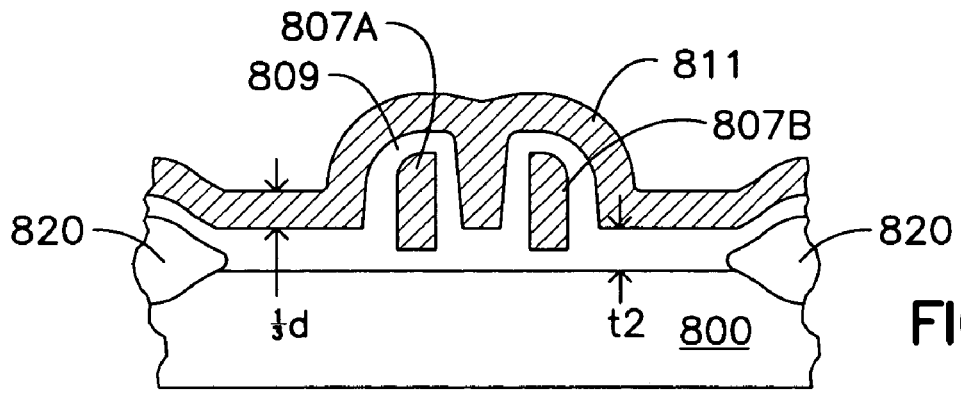

FIG. 8E shows the structure following the next series of steps. In FIG. 8E, another, or second, polysilicon layer 811 is formed over the oxide layer 809 to a thickness of approximately ⅓ d. In one embodiment the second polysilicon layer 811 has a thickness of approximately 100 nm. Forming the second polysilicon layer 811 over the oxide layer 809 can be performed using any similar technique to those used in forming the first polysilicon layer 806 as described in detail in connection with FIG. 8B. As shown in FIG. 8E, the second polysilicon layer 811 will be separated by a second oxide thickness, or second insulator thickness (t2) from the active device region 804 which is slightly greater than the thin tunnel oxide thickness, e.g. first oxide thickness or first insulator thickness (t1) which separates the vertical gate structures 807A and 807B from the substrate 800. In one embodiment the second oxide thickness, or second insulator material thickness (t2) is less than 150 Å thick. In one embodiment, the second oxide thickness (t2) is approximately 100 Angstroms (Å) thick. The structure is now as appears in FIG. 8E.

Figure 8F:
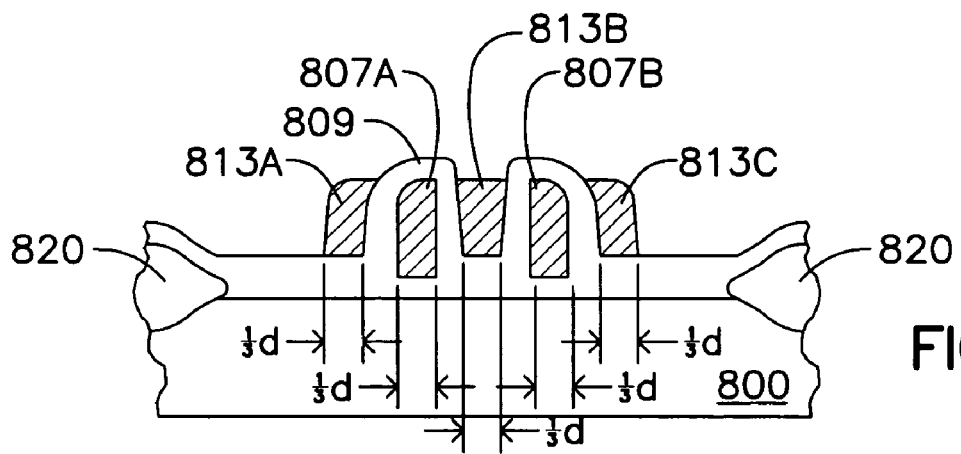

FIG. 8F illustrates the structure after the next series of steps. In FIG. 8F, the structure is once again subjected to an anisotropic etch. The anisotropic etch includes the anisotropic etching process used for etching the first polysilicon layer 806 to form the vertical gate structures 807A and 807B as described in more detail in connection with FIG. 8C. FIG. 8F shows one embodiment of the present invention in which the resulting structure is symmetrical, including a group of five free standing vertical polysilicon gates. The group of five free standing vertical gates include the original vertical gate structures 807A and 807B, and new vertical gate structures 813A, 813B, and 813C parallel to and on opposing sides of each original vertical gate structures 807A and 807B. This structure embodiment is now as appears in FIG. 8F. This can be followed by oxidation of the exposed polysilicon gates, 813A, 813B, and 813C. In one embodiment, the structure is oxidized to form an oxide layer of approximately 50 nm. The oxidation process of the structure can be performed using any suitable technique as the same has been describe above. An ion implantation is then performed to activate source and drain regions using standard techniques in CMOS process technology.

One of ordinary skill in the art will understand that other source and drain region configurations can be activated through various ion implantation techniques. Additionally, in one embodiment, the source and/or drain regions can be fabricated with source and/or drain extensions for facilitating tunneling, by using a masking step and another implantation as the same is known and understood by one of ordinary skill in the art. Also, according to the teachings of the present invention, other arrangements of gates, 807A, 807B, 813A, 813B, and 813C and different gate oxide thickness, t1 and t2, under the gates 807A, 807B, 813A, 813B, and 813C can be fabricated by variations on this process. The invention is not so limited.

Figure 9A:
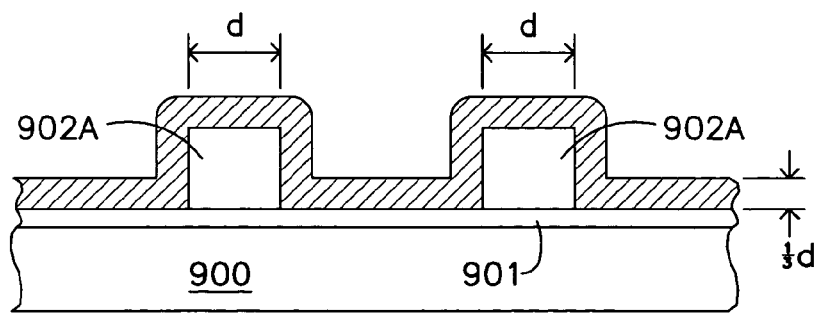
FIGS. 9A–9D illustrate an embodiment of a variation on the fabrication process shown in FIGS. 8A–8F.
Figure 9B:
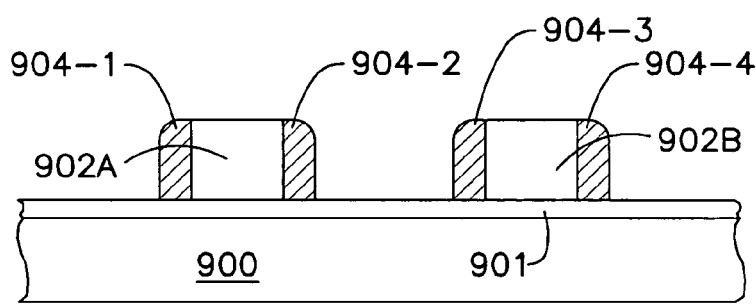
Figure 9C:
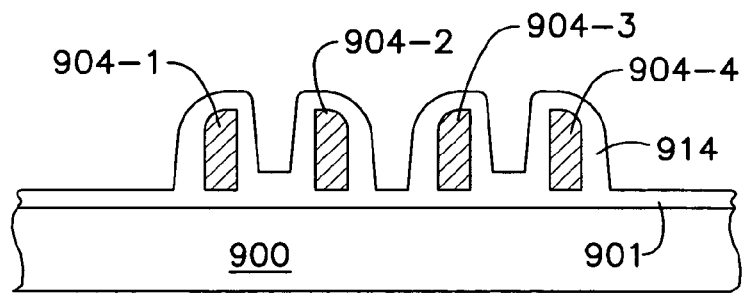
Figure 9D:
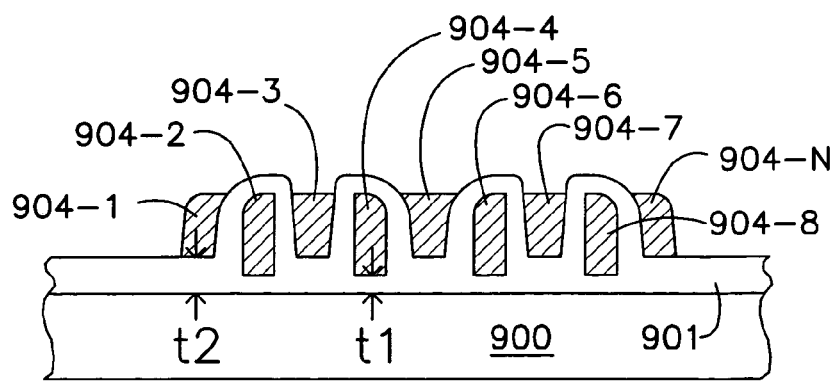

FIGS. 9A–9D illustrate an embodiment of a variation on the fabrication process shown in FIGS. 8A–8F. FIG. 9A shows the use of adjacent thick CVD oxide structures, 902A and 902B, in the beginning steps of the process. As one of ordinary skill in the art will understand upon reading this disclosure, the adjacent thick CVD oxide structures, 902A and 902B, are formed according to the same process steps shown and described in detail in FIGS. 8A and 8B for forming a thick oxide layer 802 over thin gate oxide 801. The remaining process steps illustrated in FIGS. 9B–9D follow the same method shown and described in detail in connection with FIGS. 8C–8F to fabricate a long chain of vertical gates 904-1, 904-2, . . . , 904-N. This embodiment leaves a series of vertical gates 904-1, 904-2, . . . , 904-N with alternating thin (t1) and thick (t2) gate oxides. This structure embodiment is now as appears in FIG. 9D. Again, this can be followed by oxidation of the exposed polysilicon vertical gates 904-1, 904-3, . . . , 904-N. In one embodiment, the structure is oxidized to form an oxide layer of approximately 50 nm. The oxidation process of the structure can be performed using any suitable technique as the same has been describe above. An ion implantation is then performed to activate source and drain regions using standard techniques in CMOS process technology. As one of ordinary skill in the art will understand upon reading this disclosure, this process can be followed to produce a long chain of vertical gates 904-1, 904-2, . . . , 904-N above a horizontal depletion mode channel region and separating a single source and a single drain region.

Figure 10A:
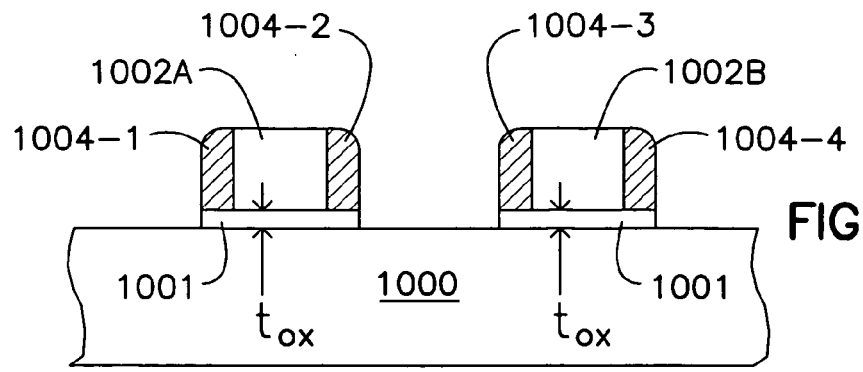
FIGS. 10A–10C illustrate another embodiment of a variation on the fabrication process to make all of the gates over thin gate oxides.
Figure 10B:
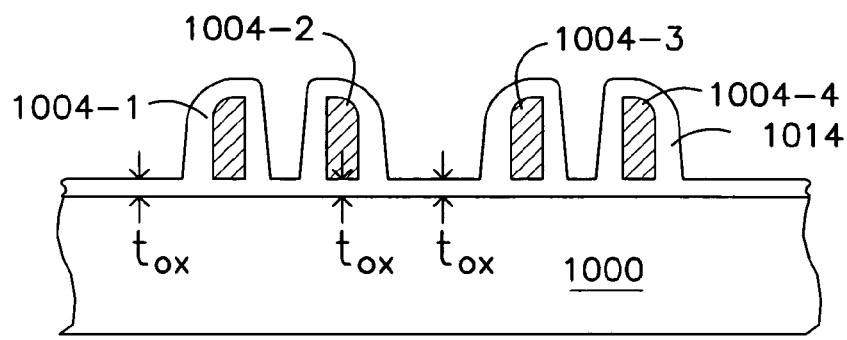
Figure 10C:
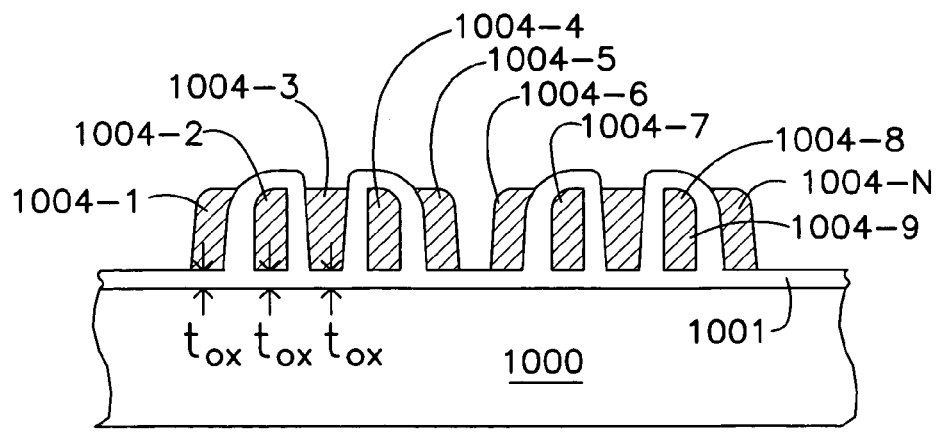

FIGS. 10A–10C illustrate another embodiment of a variation on the fabrication process to make all of the vertical gates over thin gate oxides. In the embodiment shown in FIG. 10A, the process outlined in FIGS. 8A–8F is changed in the process described in detail in connection with FIG. 8C. In FIG. 10A, the etch process described in FIG. 8C is performed to etch the polysilicon 806 anisotropically. This produces the structure shown in FIG. 10A with only thick oxide blocks 1002A and 1002B and polysilicon vertical gates 1004-1, 1004-2, . . . , 1004-N separated from the horizontal depletion mode channel by thin gate oxide 1001. Then the process is to etch portions of the gate oxide 801 over the silicon substrate 800 between the blocks of thick oxide 802. Next, as shown in FIG. 10B, the polysilicon vertical gates 1004-1, 1004-2, . . . , 1004-N and the exposed substrate 1000 are both oxidized according to the methods described in connection with FIG. 8D to give a thin gate oxide thickness (tox) on the substrate 1000 equivalent to the thin gate oxide thickness (tox) beneath the thick oxides 1002A and 1002B and the polysilicon vertical gates 1004-1, 1004-2, . . . , 1004-N. As one of ordinary skill in the art will understand upon reading this disclosure the process sequence can be completed as subsequently outlined in FIGS. 8E and 8F. The structure then appears as shown in FIG. 10C. In one embodiment, the structure is oxidized to form an oxide layer of approximately 50 nm. The oxidation process of the structure can be performed using any suitable technique as the same has been described above. An ion implantation is then performed to activate source and drain regions using standard techniques in CMOS process technology. As one of ordinary skill in the art will understand upon reading this disclosure, this process can be followed to produce a long chain of vertical polysilicon vertical gates 1004-1, 1004-2, . . . , 1004-N above a horizontal depletion mode channel region separating a single source and a single drain region. The result in this embodiment is that all of the vertical polysilicon vertical gates 1004-1, 1004-2, . . . , 1004-N will be over a thin gate oxide (tox). In other words, in this embodiment, all of the polysilicon vertical gates 1004-1, 1004-2, . . . , 1004-N will be active gates able to control conduction in the horizontal depletion mode channel beneath the polysilicon vertical gates 1004-1, 1004-2, . . . , 1004-N.

Figure 11A:
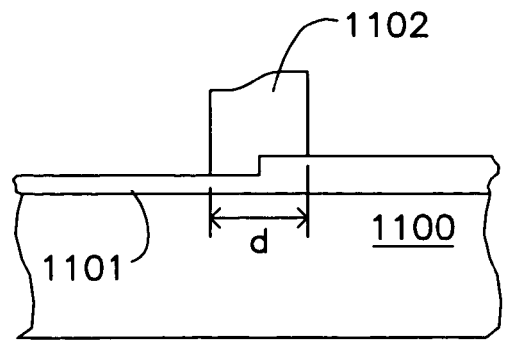
FIGS. 11A–11D illustrate another embodiment of a variation on the fabrication process to allow the fabrication of different gate oxide thicknesses under various gates to make some lines active and others as passing lines.
Figure 11B:
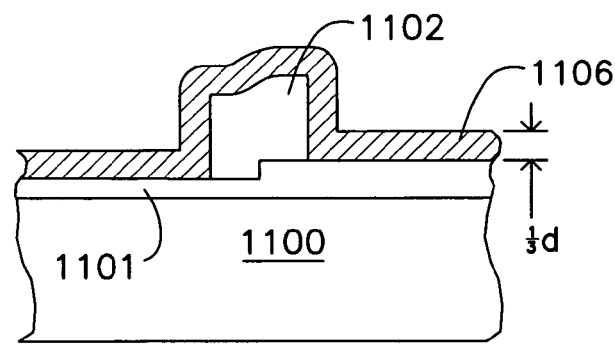
Figure 11C:
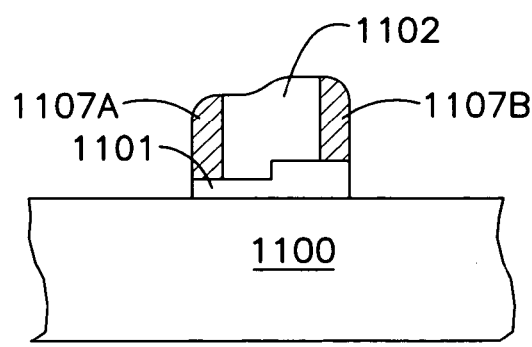
Figure 11D:
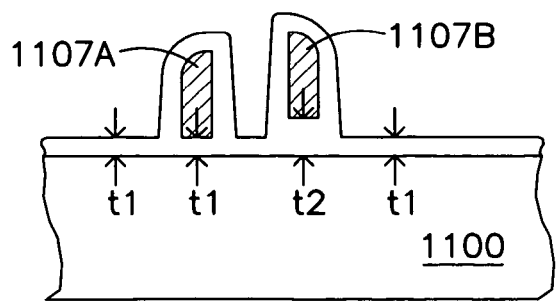

FIGS. 11A–11C illustrate another embodiment of a variation on the fabrication process to allow the fabrication of different gate oxide thicknesses under various gates to make some lines active and others as passing lines. In other words, FIGS. 11A–11C outline a technique to make some of the original gates over thin gate oxide (t1) and others over the thicker gate oxide (t2). As shown in FIG. 11A, the thick oxide 1102 is deposited over a step in the gate oxide thickness 1101 which has a thickness of both (t1) and (t2). The process then follows the same as outlined in connection with FIGS. 8A and 8B. In FIG. 11C, however, the etching process described in FIG. 8C is performed not only to etch the polysilicon 806 anisotropically, but then to also etch portions of the gate oxide 801 over the silicon substrate 800 outside of the block of thick oxide 802. This produces the structure shown in FIG. 1C. Next, the exposed silicon substrate 1100 and the polysilicon gates 1107A and 1107B are oxidized to form an oxide layer which has a thickness equivalent to the thin gate oxide thickness (t1). The structure is now as appears in FIG. 11D. In one embodiment, the thin gate oxide has a thickness (t1) of less than 50 Å. In one embodiment, the thin gate oxide has a thickness (t1) of approximately 33 Å. The oxidation process of the structure can be performed using any suitable technique as the same has been described above. As shown in FIG. 11D, this results in a structure where vertical polysilicon gate 1107A is over a thin gate oxide (t1) and vertical polysilicon gate 1107B is over a thick gate oxide (t2). As one of ordinary skill in the art will understand upon reading this disclosure, this process can be followed to produce a long chain of vertical polysilicon vertical gates. In one embodiment, any additional adjacent vertical polysilicon gates can be formed over the thin gate oxide (t1) such that only one vertical gate serves as a passing line. Otherwise, the described process can be repeated in the same fashion such that multiple passing lines are formed. An ion implantation is then performed to activate source and drain regions using standard techniques in CMOS process technology.

In still an alternative embodiment of FIG. 11D the exposed silicon substrate 1100 of FIG. 11C and the polysilicon gates 1107A and 1107B can be oxidized to form an oxide layer which has a thickness equivalent to the thick, or second gate oxide thickness (t2). This will result in one vertical polysilicon gate over a thin gate oxide, or first gate oxide, thickness (t1) and one vertical polysilicon gate and any additional vertical polysilicon gates over the thicker, or second gate oxide, thickness (t2). As one of ordinary skill in the art will understand upon reading this disclosure, this process can be followed to produce a long chain of vertical polysilicon vertical gates. In one embodiment, any additional adjacent vertical polysilicon gates can be formed over the thicker, or second gate oxide thickness (t2) such that only one vertical gate serves as a active input. Otherwise, the described process can be repeated in the same fashion such that multiple active inputs are formed.

As one of ordinary skill in the art will understand upon reading this disclosure, an ion implantation is then performed to activate source and drain regions using standard techniques in CMOS process technology. This will result in multiple vertical polysilicon gates above a horizontal depletion mode channel region separating a single source and a single drain region according to the teachings of the present invention. In the embodiment, described in FIGS. 11A–11D vertical polysilicon gate 1107A will be an active gate which is able to control the conduction in the horizontal depletion mode channel and vertical polysilicon gate 1107B will be a passing line which does not effect conduction in the horizontal depletion mode channel.

One of ordinary skill in the art will understand upon reading this disclosure, that by a combination of the process methods described in FIGS. 8–11, and other variations, that a series of vertical polysilicon gates with a wide variety of gate oxide thickness combinations can be formed. Some of the vertical polysilicon gates over a thin, or first, gate oxide thickness (t1) will serve as active gates and others of the vertical polysilicon gates over a thicker, or second, gate oxide thickness all between a single source and drain region will act as passing lines.

According to the teachings of the present invention, if all of the multiple vertical gates are input lines then less than one MOSFET transistor would be required per logic input. The vertical gates formed above a thin, first oxide, thickness (t1) will be active inputs such that their gate voltages can control the channel conductivity in the horizontal depletion mode channel. Conversely, the vertical gates formed above a thicker, second oxide, thickness (t2) will be passing lines such that their gate voltages can not control the channel conductivity. In one embodiment, according to the teachings of the present invention, if the active gates are at their most negative potential where VGS is less than VT then this particular region of the channel will not be turned on and will not conduct. The action of the gates, if addressed with the most positive logic input voltage which in one embodiment will be zero volts, is to turn the portion of the channel beneath the vertical gate "on." Thus, a number of logic circuits, such as a NAND circuit, can be formed according to the teachings of the present invention. Unless all the active inputs are in such a state to allow conduction, their most positive voltage, no signal will propagate through the horizontal depletion mode channel underneath the chain of vertical gates.

Figure 12A:
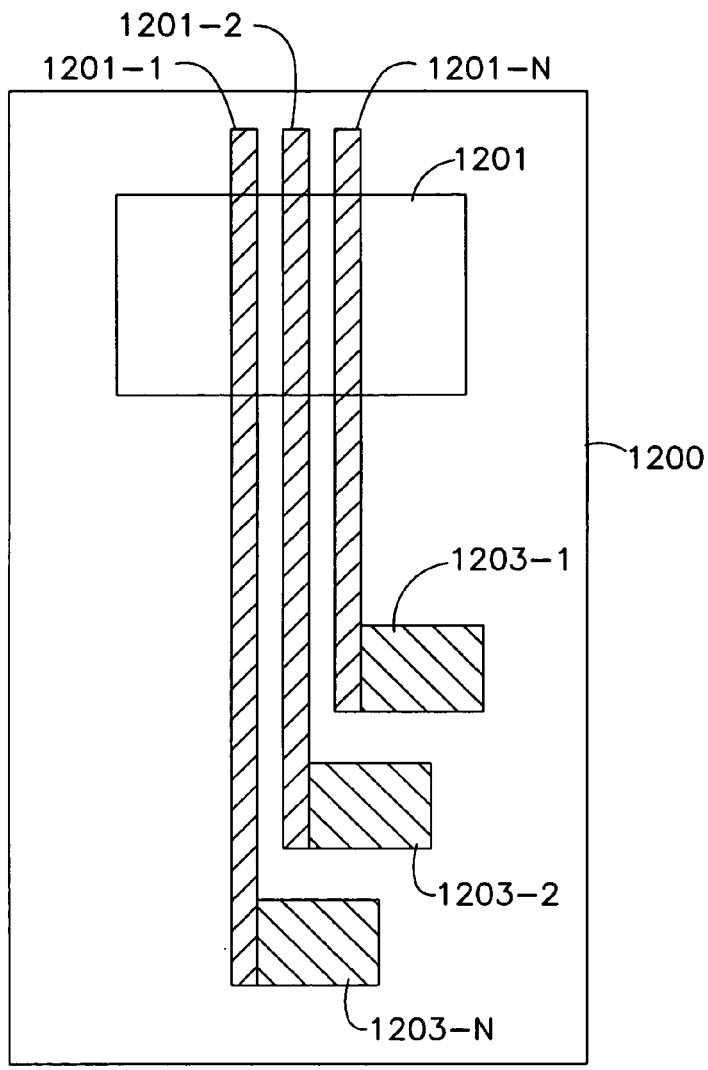
FIGS. 12A and 12B are illustrations of an embodiment in which a number of input lines which collectively pass over multiple MOSFET logic cells is a logic circuit block, can be contacted at the edge of a logic circuit according to the teachings of the present invention.
Figure 12B:

FIG. 12 is an illustration of an embodiment in which a number of input lines 1201-1, 1201-2, . . . , 1201-N, which collectively pass over multiple MOSFET logic cells in a logic circuit represented by logic circuit block 1201, can be contacted at the edge of a logic circuit array 1200 according to the teachings of the present invention. As shown in FIG. 12 the input lines, or vertical gate lines 1201-1, 1201-2, . . . , 1201-N run up beside a conductive block of polysilicon or other conductor, shown as 1203-1, 1203-2, . . . , 1203-N, at the edge of a logic circuit array 1200. The logic circuit array 1200 includes, but is not limited to, the logic circuits described and explained in detail in connection with FIGS. 5–7. FIG. 12 thus represents one embodiment in which multiple vertical gate or input lines 1201-1, 1201-2, . . . , 1201-N, which have sub-lithographic dimensions and pass over single MOSFET logic cells can be contacted to independent potential sources to perform a multitude of logic functions.

Figure 13:
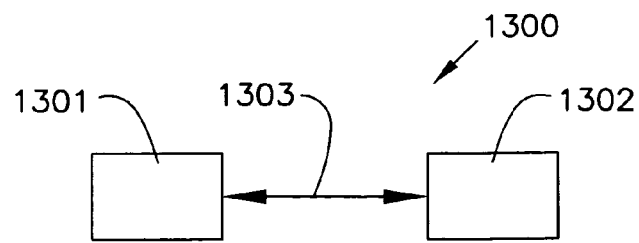
FIG. 13 illustrates a block diagram of an embodiment of an electronic system according to the teachings of the present invention.

FIG. 13 illustrates a block diagram of an embodiment of an electronic system 1300 according to the teachings of the present invention. In the embodiment shown in FIG. 13, the system 1300 includes a logic circuit 1301 which has an array of logic cells formed according to the teachings of the present invention. The logic device is coupled to a processor 1302 by a bus 1303. In one embodiment, the processor 1302 and the logic device 1301 are located on a single chip.

It will be understood that the embodiment shown in FIG. 13 illustrates an embodiment for electronic system circuitry in which the novel static pass transistors, or logic cells of the present invention are included. The illustration of system 1300, as shown in FIG. 13, is intended to provide a general understanding of one application for the structure and circuitry of the present invention, and is not intended to serve as a complete description of all the elements and features of an electronic system using the novel logic cell structures.

Applications containing the novel logic cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

The Figures presented and described in detail above are similarly useful in describing the method embodiments of operation for novel memory cell of the present invention. That is one embodiment of the present invention includes a method for operating a static pass gate transistor. The method includes applying a potential to a number of vertical gates located above different portions of a horizontal depletion mode channel. At least one of the vertical gates is separated from the depletion mode channel by a first oxide thickness, and at least one of the vertical gates is separated from the depletion mode channel by a second oxide thickness. The method further includes sensing a conduction level through the depletion mode channel. Applying a potential to the number of vertical gates includes applying the potential to a number of active inputs for the static pass gate transistor. Applying the potential to the number of active inputs controls conduction in the depletion mode channel such that the static pass gate transistor functions as a NAND gate. In one embodiment, applying the potential to the number of vertical gates includes applying a negative potential of approximately −0.6 Volts to at least one of the vertical gates such that the vertical gate turns off conduction in the depletion mode channel. Also, applying a potential to the number of vertical gates includes applying the potential to a number of passing lines.

Another method embodiment according to the teachings of the present invention includes a method for operating a logic circuit. The method includes using a number of vertical gates located above a horizontal depletion mode channel between a single source region and a single drain region to provide an applied potential above the depletion mode channel. At least one of the vertical gates is separated from the depletion mode channel by a first oxide thickness and at least one of the vertical gates is separated from the depletion mode channel by a second oxide thickness. The method further includes using at least one of the number of vertical gates as a passing line such that a potential on the passing line does not effect conduction in the depletion mode channel. The method includes using at least two of the number of vertical gates as a number of active inputs such that the active inputs control conduction in the depletion mode channel. According to the teachings of the present invention the method further includes independently applying potential values to the number of vertical gates. Independently applying potential values to the active inputs includes performing a logic function. In one embodiment, performing a logic function includes performing a NAND logic function. In one embodiment, using at least two of the number of vertical gates as a number of active inputs such that the active inputs control conduction in the depletion mode channel includes applying a negative potential to the active inputs of approximately −0.6 Volts to turn off conduction in the depletion mode channel region. Using at least one of the number of vertical gates as a passing line includes using at least one of the number of vertical gates separated from the depletion mode channel by the second oxide thickness as the passing line where the second oxide thickness is greater than the first oxide thickness. The method of the present invention further includes sensing a conduction level through the horizontal depletion mode channel to sense a state of the logic circuit. Using a number of vertical gates located above a horizontal depletion mode channel between a single source region and a single drain region to provide an applied potential above the depletion mode channel includes using a number of edged defined vertical gates such that the vertical gates have a horizontal width which is sub-lithographic in dimension. According to the teachings of the present invention, using a number of edged defined vertical gates such that the vertical gates have a horizontal width which is sub-lithographic in dimension includes using the edge defined vertical gates as a number of logic inputs such that less than one MOSFET is required for a number of logic inputs.

CONCLUSION

Thus, the present invention provides novel structures and methods for static pass transistor technology. The novel static pass transistors of the present invention provide logic gates where each logic input is less than one transistor. In a conventional NMOS NAND logic circuit each logic input goes to the gate of a separate transistor each with a source, drain and gate. According to the teachings of the present invention, there is no source or drain region associated with each input and the vertical gates, or logic inputs, have sub-lithographic horizontal dimensions by virtue of being edge defined gates. This results in a minimal area being associated with each logic input.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method for forming a static pass transistor, comprising:
    forming a source region and a drain region in a horizontal substrate;
    forming a depletion mode channel in the horizontal substrate between the source and the drain regions;
    forming a number of vertical gates above different portions of the depletion mode channel;
    wherein forming a number of vertical gates includes forming at least one of the vertical gates separated from the depletion mode channel by a first oxide thickness (t1); and
    wherein forming a number of vertical gates includes forming at least one of the vertical gates separated from the depletion mode channel region by a second oxide thickness (t2).

2. The method of claim 1, wherein forming a number of vertical gates above different portions of the depletion mode channel includes forming a number of edge defined vertical gates such that each vertical gate has a horizontal width which is sub-lithographic in dimension.

3. The method of claim 1, wherein forming a number of vertical gates above different portions of the depletion mode channel includes forming a number of logic inputs for the static pass transistor.

4. The method of claim 1, wherein forming the static pass transistor includes forming a NAND logic cell.

5. The method of claim 1, wherein forming at least one of the vertical gates separated from the depletion mode channel by a first oxide thickness (t1) includes forming at least one of the vertical gates as an active input for the static pass transistor such that the at least one of the vertical gates separated from the depletion mode channel by a first oxide thickness (t1) controls conduction in the depletion mode channel.

6. The method of claim 5, wherein forming at least one of the vertical gates separated from the depletion mode channel by a first oxide thickness (t1) includes forming a first oxide thickness of less than 50 Angstroms (Å).

7. The method of claim 1, wherein forming at least one of the vertical gates separated from the depletion mode channel by a second oxide thickness (t1) includes forming at least one of the vertical gates as a passing line such that the at least one of the vertical gates separated from the depletion mode channel by a second oxide thickness (t1) has a minimal or no control over conduction in the depletion mode channel.

8. The method of claim 7, wherein forming at least one of the vertical gates separated from the depletion mode channel by a second oxide thickness (t1) includes forming a second oxide thickness of less than 150 Angstroms (Å).

9. A method for forming a logic gate transistor, comprising:
    forming a source region and a drain region in a horizontal substrate;

forming a depletion mode channel between the source and the drain regions;

forming a first vertical gate located above a first portion of the depletion mode channel and separated from the depletion mode channel by a first oxide thickness;

forming a second vertical gate located above a second portion of the depletion mode channel and separated from the depletion mode channel by a second oxide thickness; and forming a third vertical gate located above a third portion of the depletion mode channel and separated from the depletion mode channel by the second oxide thickness.

10. The method of claim 9, wherein forming the second and the third vertical gates includes forming the second and the third vertical gates as active inputs for the logic gate transistor such that the second and the third vertical gates control conduction in the depletion mode channel.

11. The method of claim 9, wherein forming the first vertical gate includes forming a passing line such that the first vertical gate has a minimal or no control over conduction in the depletion mode channel.

12. The method of claim 9, wherein forming a first vertical gate separated from the depletion mode channel by a first oxide thickness and forming a second and a third vertical gate separated from the depletion mode channel by a second oxide thickness includes forming a first oxide thickness which has a thickness greater than the second oxide thickness.

13. The method of claim 9, wherein forming the first, the second, and the third vertical gates includes forming edge defined polysilicon gates which are separated from one another by silicon dioxide ($SiO_2$).

14. The method of claim 13, wherein forming the edge defined polysilicon gates includes forming edge defined polysilicon gates to have a sub-lithographic horizontal width.

15. The method of claim 9, wherein forming a first vertical gate separated from the channel region by a first oxide thickness includes forming a first oxide thickness of approximately 33 Angstroms (Å), and wherein forming a second and a third vertical gate separated from the channel region by a second oxide thickness includes forming a second oxide thickness of approximately 100 Angstroms (Å).

16. A method for operating a static pass gate transistor, comprising:

applying a potential to a number of vertical gates located above different portions of a horizontal depletion mode channel, wherein at least one of the vertical gates is separated from the depletion mode channel by a first oxide thickness, and wherein at least one of the vertical gates is separated from the depletion mode channel by a second oxide thickness; and sensing a conduction level through the depletion mode channel.

17. The method of claim 16, wherein applying a potential to the number of vertical gates includes applying the potential to a number of active inputs for the static pass gate transistor.

18. The method of claim 17, wherein applying the potential to the number of active inputs controls conduction in the depletion mode channel such that the static pass gate transistor functions as a NAND gate.

19. The method of claim 17, wherein applying the potential to the number of active inputs includes applying a negative potential of approximately −0.6 Volts to at least one of the active inputs such that the active input turns off conduction in the depletion mode channel.

20. The method of claim 16, wherein applying a potential to the number of vertical gates includes applying the potential to a number of passing lines.

21. A method for operating a logic circuit, comprising:

using a number of vertical gates located above a horizontal depletion mode channel between a single source region and a single drain region to provide an applied potential above the depletion mode channel, wherein at least one of the vertical gates is separated from the depletion mode channel by a first oxide thickness, and wherein at least one of the vertical gates is separated from the depletion mode channel by a second oxide thickness vertical;

using at least one of the number of vertical gates as a passing line such that a potential on the passing line does not effect conduction in the depletion mode channel; and using at least two of the number of vertical gates as a number of active inputs such that the active inputs control conduction in the depletion mode channel.

22. The method of claim 21, wherein the method further includes independently applying potential values to the number of vertical gates.

23. The method of claim 22, wherein independently applying potential values to the number of vertical gates includes performing a logic function.

24. The method of claim 23, wherein performing a logic function includes performing a NAND logic function.

25. The method of claim 21, wherein using at least two of the number of vertical gates as a number of active inputs such that the active inputs control conduction in the depletion mode channel includes applying a negative potential to the active inputs of approximately −0.6 Volts to turn off conduction in the depletion mode channel region.

26. The method of claim 21, wherein using at least one of the number of vertical gates as a passing line includes using at least one of the number of vertical gates separated from the depletion mode channel by the second oxide thickness as the passing line, wherein the second oxide thickness is greater than the first oxide thickness.

27. The method of claim 21, wherein the method further includes sensing a conduction level through the horizontal depletion mode channel to sense a state of the logic circuit.

28. The method of claim 21, wherein using a number of vertical gates located above a horizontal depletion mode channel between a single source region and a single drain region to provide an applied potential above the depletion mode channel includes using a number of edged defined vertical gates such that the vertical gates have a horizontal width which is sub-lithographic in dimension.

29. The method of claim 28, wherein using a number of edged defined vertical gates such that the vertical gates have a horizontal width which is sub-lithographic in dimension includes using less than one MOSFET for a number of logic inputs.

30. A method of forming a static pass transistor, comprising;

forming a source region and a drain region on a horizontal substrate;

forming a depletion mode channel in the horizontal substrate between the source region and the drain region;

forming a number of vertical gates above different portions of the depletion mode channel;

wherein forming a number of vertical gates includes forming at least one of the vertical gates separated from the depletion mode channel by a first oxide thickness (t1); and wherein forming a number of vertical gates includes forming at least one of the vertical gates separated from the depletion mode channel by a second oxide thickness (t2).

31. The method of claim 30, wherein forming a number of vertical gates above different portions of the depletion mode channel includes forming a number of edge defined vertical gates such that each vertical gate has a horizontal width which has sub-lithographic dimensions.

32. The method of claim 30, wherein forming a number of vertical gates above different portions of the depletion mode channel includes forming a number of logic inputs for a static pass transistor.

33. The method of claim 32, wherein forming the static pass transistor includes forming a NAND logic cell.

34. The method of claim 30, wherein forming at least one of the vertical gates separated from the depletion mode channel by a first oxide thickness (t1) includes forming at least one of the vertical gates as an active input for a static pass transistor such that the at least one of the vertical gates separated from the depletion mode channel by the first oxide thickness (t1) controls conduction in the depletion mode channel.

35. The method of claim 34, wherein the first oxide thickness (t1) is less then 50 Angstroms (Å).

36. The method of claim 35, wherein the first oxide thickness (t1) is about 33 Angstroms (Å).

37. The method of claim 30, wherein forming at least one of the vertical gates separated from the depletion mode channel by a second oxide thickness (t2) includes forming at least one of the vertical gates as a passing line such that the at least one of the vertical gates separated from the depletion mode channel by the second oxide thickness (t2) has a minimal or no control over conduction in the depletion mode channel.

38. The method of claim 36, wherein the second oxide thickness (t2) is less then 150 Angstroms (Å).

39. The method of claim 38, wherein the second oxide thickness (t2) is about 100 Angstroms (Å).

40. A method for forming a logic gate transistor, comprising:

forming a source region and a drain region in a horizontal substrate;

forming a depletion mode channel between the source region and the drain regions;

forming a first vertical gate located above a first portion of the depletion mode channel and separated from the depletion mode channel by a first oxide thickness;

forming a second vertical gate located above a second portion of the depletion mode channel and separated from the depletion mode channel by a second oxide thickness; and forming a third vertical gate located above a third portion of the depletion mode channel and separated from the depletion mode channel by the second oxide thickness.

41. The method of claim 40, wherein forming the second and third vertical gates includes forming the second and third vertical gates as active inputs for the logic gate transistor such that the second and the third vertical gates control conduction in the depletion mode channel.

42. The method of claim 40, wherein forming the first vertical gate includes forming a passing line such that the first vertical gate has a minimal or no control over conduction in the depletion mode channel.

43. The method of claim 40, wherein the first oxide thickness is greater then the second oxide thickness.

44. The method of claim 40, wherein forming the first, second and the third vertical gates includes forming edge defined polysilicon gates which are separated from one another by silicon dioxide ($SiO_2$).

45. The method of claim 44, wherein the edge defined polysilicon gates have a sub-lithographic horizontal width.

46. The method of claim 40, wherein the first oxide thickness is about 33 Angstroms (Å), and the second oxide thickness is about 100 Angstroms (Å).

47. A method for operating a static pass transistor, comprising:

applying a potential to a number of vertical gates located above different portions of a horizontal depletion mode channel, wherein at least one of the vertical gates is separated from the depletion mode channel by a first oxide thickness, and wherein at least one of the vertical gates is separated from the depletion mode channel by a second oxide thickness; and sensing a conduction level through the depletion mode channel.

48. The method of claim 47, wherein applying a potential to a number of vertical gates includes applying a potential to a number of active inputs for the static pass gate transistor.

49. The method of claim 48, wherein applying the potential to the number of active inputs controls conduction in the depletion mode channel such that the static pass gate transistor functions as a NAND gate.

50. The method of claim 48, wherein applying the potential to the number of active inputs includes applying a negative potential of approximately –0.6 Volts to at least one of the active inputs such that the active input turns off conduction in the depletion mode channel.

51. The method of claim 47, wherein applying a potential to the number of vertical gates includes applying the potential to a number of passing lines.

52. A method of operating a logic circuit, comprising:

using a number of vertical gates located above a horizontal depletion mode channel between a single source region and a single drain region to provide an applied potential above the depletion mode channel, wherein at least one of the vertical gates is separated from the depletion mode channel by a first oxide thickness, and wherein at least one of the vertical gates is separated from the depletion mode channel by a second oxide thickness vertical;

using at least one of the number of vertical gates as a passing line such that a potential on the passing line does not effect conduction in the depletion mode channel; and using at least two of the number of vertical gates as a number of active inputs such that the active inputs control conduction in the depletion mode channel.

53. The method of claim 52, wherein the method further includes independently applying potential values to the number of vertical gates.

54. The method of claim 53, wherein independently applying potential values to the number of vertical gates includes performing a logic function.

55. The method of claim 54, wherein the logic function is a NAND function.

56. The method of claim 52, wherein using at least two of the number of vertical gates as a number of active inputs such that the active inputs control conduction in the depletion mode channel includes applying a negative potential to the active inputs of approximately −0.6 Volts to turn off conduction in the depletion mode channel region.

57. The method of claim 52, wherein using at least one of the number of vertical gates as a passing line includes using at least one of the number of vertical gates separated from the depletion mode channel by the second oxide thickness as the passing line, wherein the second oxide thickness is greater then the first oxide thickness.

58. The method of claim 52, wherein the method further includes sensing a conduction level through the horizontal depletion mode channel to sense a state of the logic circuit.

59. The method of claim 52, wherein using a number of vertical gates located above a horizontal depletion mode channel between a single source region and a single drain region to provide an applied potential above the depletion mode channel includes using a number of edge defined vertical gates such that the vertical gates have a horizontal width which has sub-lithographic dimensions.

60. The method of claim 59, wherein using a number of edge defined vertical gates such that the vertical gates have a horizontal width which has sub-lithographic dimensions includes using less then one MOSFET for a number of logic inputs.

* * * * *

UNITED STATES PATENT AND TRADEMARK OFFICE
CERTIFICATE OF CORRECTION

PATENT NO. : 6,991,988 B2
DATED : January 31, 2006
INVENTOR(S) : Forbes et al.

It is certified that error appears in the above-identified patent and that said Letters Patent is hereby corrected as shown below:

Column 6,
Line 43, delete "a" and insert -- an --.

Column 7,
Line 25, delete "$0.353 \times 10^{-12}$" and insert -- $0.353 \times 10^{12}$ --.

Column 8,
Line 67, delete "a" and insert -- an --.

Column 13,
Line 61, delete "technol.," and insert -- Technol., --.

Column 15,
Lines 8 and 45, delete "describe" and insert -- described --.

Column 17,
Line 15, delete "a" and insert -- an --.

Column 22,
Lines 60-61, delete "comprising;" and insert -- comprising: --.

Signed and Sealed this

Twenty-eighth Day of March, 2006

JON W. DUDAS
*Director of the United States Patent and Trademark Office*